(12) United States Patent
Yoshino

(10) Patent No.: US 6,927,446 B2
(45) Date of Patent: *Aug. 9, 2005

(54) NONVOLATILE SEMICONDUCTOR MEMORY DEVICE AND ITS MANUFACTURING METHOD

(75) Inventor: Akira Yoshino, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/418,057

(22) Filed: Apr. 18, 2003

(65) Prior Publication Data

US 2003/0203572 A1 Oct. 30, 2003

(30) Foreign Application Priority Data

Apr. 25, 2002 (JP) ........................................ 2002-123857

(51) Int. Cl.⁷ ............................................... H01L 29/76
(52) U.S. Cl. ........................ 257/314; 257/315; 257/316; 257/324; 257/325; 438/257
(58) Field of Search ................... 257/314, 315, 257/316, 318, 324, 325; 438/257

(56) References Cited

U.S. PATENT DOCUMENTS

| | | | |
|---|---|---|---|
| 5,168,334 A | * 12/1992 | Mitchell et al. ............ 257/324 |
| 5,768,192 A | 6/1998 | Eitan | |
| 5,874,759 A | * 2/1999 | Park ............................ 257/314 |
| 5,966,603 A | 10/1999 | Eitan | |
| 6,265,265 B1 | * 7/2001 | Lim ............................ 438/257 |
| 6,335,554 B1 | * 1/2002 | Yoshikawa .................. 257/316 |
| 6,727,144 B2 | * 4/2004 | Hashimoto .................. 438/257 |
| 6,828,619 B2 | * 12/2004 | Yoshino ...................... 257/314 |
| 2003/0203572 A1 | * 10/2003 | Yoshino ...................... 438/257 |

OTHER PUBLICATIONS

Hayashi et al., "Twin MONOS Cell with Dual Control Gates", 2000 Symposium on VLSTI Technology Digest of Technical Papers; pp. 122–123 (13.2).

* cited by examiner

Primary Examiner—Maria F. Guerrero
(74) Attorney, Agent, or Firm—McGinn & Gibb, PLLC

(57) ABSTRACT

A first diffused layer and a second diffused layer are formed on the major surface of a silicon substrate. A first insulating layer, a second insulating layer or a semiconductor layer, and a third insulating layer are laminated on the major surface of the silicon substrate in the vicinity of the first diffused layer or the second diffused layer and are partially formed. A fourth insulating layer is formed as a gate insulating film. A fifth insulating layer is formed on the side walls of the second insulating layer or the semiconductor layer. In a region of most of a channel, the gate insulating film is formed and a gate electrode is formed so that it covers the gate insulating film and the laminated films. According to this structure, the operating voltage of a flash memory is reduced, the operation is easily sped up and the holding characteristic of information charge can be enhanced.

21 Claims, 26 Drawing Sheets

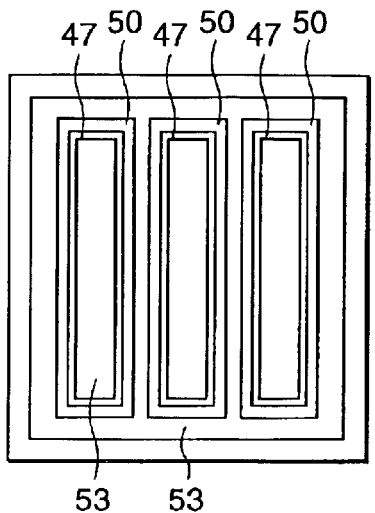
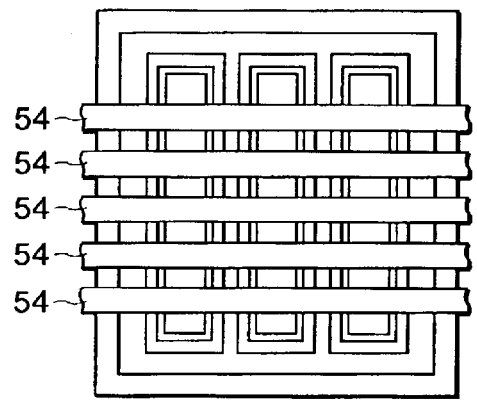
FIG.26A                FIG.26B
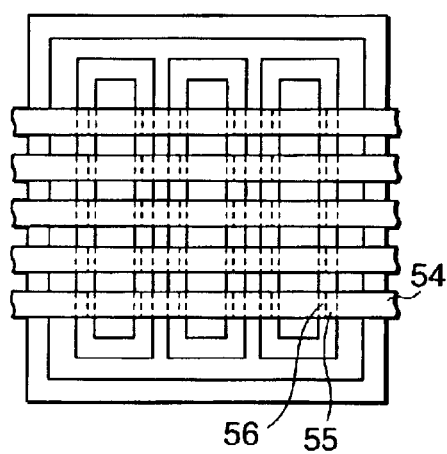
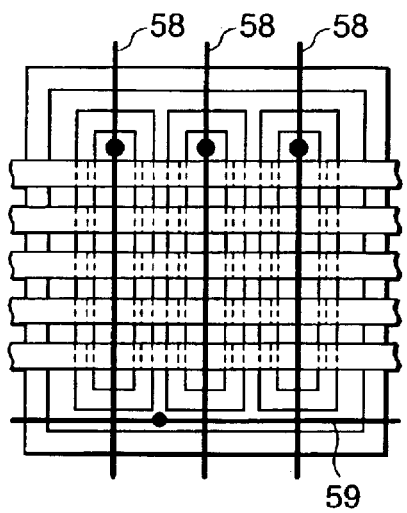
FIG.26C                FIG.26D

NONVOLATILE SEMICONDUCTOR MEMORY DEVICE AND ITS MANUFACTURING METHOD

BACKGROUND OF THE INVENTION

1. Field of the Invention

The present invention relates to a nonvolatile semiconductor memory device and its manufacturing method, particularly relates to a metal oxide nitride oxide semiconductor (MONOS) nonvolatile semiconductor memory device and its manufacturing method.

2. Description of the Related Art

An MIS transistor for forming a nonvolatile storage cell is roughly classified into two types of a metal nitride oxide semiconductor (MNOS) transistor and a floating-gate (FG) transistor basically.

The former stores information charge in an interface area formed in a boundary region of two gate insulating films having two-layer structure. For this type of another device, there is a device called MONOS in which a silicon oxide film is formed on a silicon nitride film. There are also devices having structure in which insulating films except the silicon oxide film and the silicon nitride film are variously combined.

The latter stores information charge in a floating-gate electrode which is a first gate electrode in the structure of two gate electrodes. In this structure, the first gate electrode is formed on a silicon oxide film on the major surface of a semiconductor substrate in a floating state. An inter insulating layer composed of a silicon oxide film and a silicon nitride film is provided on the first gate electrode. Further, a second gate electrode which is a control gate electrode is formed on the layer insulating film. The second gate electrode covers the first gate electrode.

In a nonvolatile memory called a flash memory, the M(O)NOS transistor or the FG transistor described above can be basically used for a nonvolatile storage cell in the memory device, and the current all flash memories by quantity production use the FG transistor for a nonvolatile storage cell. However, in the FG transistor, the holding characteristic of information charge is not satisfactory in principle and a relatively thick silicon oxide film 9 nm or more thick is required for a tunneling oxide film between the major surface of a semiconductor substrate and a floating-gate electrode. Therefore, there is a limit in the reduction of voltage for writing and erasing information charge.

In the meantime, in an MNOS transistor, a tunneling oxide film between the major surface of a semiconductor substrate and a silicon nitride film can be easily thinned and a thin silicon oxide film 3 nm or less thick can be used. Therefore, operating voltage, particularly, voltage for writing and erasing information charge can be reduced. The operation for writing and erasing information charge of the nonvolatile storage cell is as follows.

That is, in the MNOS transistor, information charge is written by injecting an electron from the semiconductor substrate into the interface area directly through a tunnel of a silicon oxide film approximately 2 nm thick formed on the major surface of the semiconductor substrate and conversely, information charge is erased by emitting an electron from the interface area to the semiconductor substrate. Such an interface area functions as the center of the capture of an electron. A state in which information charge is written is equivalent to the logic 1 of stored information and a state in which information charge is erased is equivalent to the logic 0 of stored information. Then, to make the M(O)NOS transistor in which voltage for writing and erasing can be reduced in principle practicable as a storage cell of a nonvolatile memory such as a flash memory, various study has been recently made energetically.

For technique for using an MONOS transistor for a nonvolatile storage cell of a flash memory, there is technique disclosed in the U.S. Pat. No. 5,768,192 (hereinafter called as a first conventional type) and technique published on "2000 Symposium on VLSI Technology Digest of Technical Papers" pp. 122 and 123 (hereinafter called as a second conventional type), for example.

Then, for prior art, referring to FIGS. 1 to 4, the first conventional type will be first described below. FIG. 1 is a schematic sectional view showing an MONOS transistor proposed as a nonvolatile storage cell of a flash memory.

As shown in FIG. 1, a first diffused layer 102 and a second diffused layer 103 are formed by an $N^+$-type diffused layer on the major surface of a silicon substrate 101 of a P conductive type, for example. A first silicon oxide film 104, a silicon nitride film 105 and a second silicon oxide film 106 (ONO structure) are sequentially laminated on the silicon substrate 101 between the first diffused layer 102 and the second diffused layer 103. Further, a gate electrode 107 is formed by polycrystalline silicon on the second silicon oxide film 106. This structure is the basic structure of the MONOS transistor.

Next, referring to FIGS. 2 and 3, the basic operation of the MONOS transistor will be described. For operation for writing information charge (an electron in this case), as shown in FIG. 2A, for example, the silicon substrate 101 and the first diffused layer 102 are fixed to ground potential, the voltage $V_W$ of the second diffused layer 103 is set to approximately 4 V and the voltage $V_{GW}$ of the gate electrode 107 is set to approximately 6 V.

When such voltage is applied, an electron stream 108 (channel current) is produced from the first diffused layer 102 which functions as a source to the second diffused layer 103 which functions as a drain, which current become a channel hot electron (CHE) in the vicinity of the second diffused layer 103 and a part thereof is captured in a certain area of the silicon nitride film 105 beyond the barrier of the first silicon oxide film 104. This area is a capture area 109 shown in FIG. 2. As described above, in writing an electron, information charge is stored in an area near to the end of the second diffused layer 103 in the silicon nitride film 105. The quantity of written electrons is approximately 500 to 1000 pieces and the capture area 109 is a very small region such that the width in the lateral direction is approximately 10 nm.

Next, for operation for erasing information in the MONOS transistor, in structure shown in FIG. 2B, for example, the silicon substrate 101 and the first diffused layer 102 are fixed to ground potential, the voltage $V_E$ of the second diffused layer 103 is set to 5 V and the voltage $V_{GE}$ of the gate electrode 107 is set to approximately −5 V.

When such voltage is applied, a hole generated by tunneling between bands by the bending of a band in a region at the end of the second diffused layer 103 and overlapped with the gate electrode 107 is injected into the capture area 109 and information charge is erased. That is, as shown in the drawing, the injection of a hole 110 into the capture area 109 is caused and electrons which is information charge are erased.

Next, for operation for reading information from the MONOS transistor, as shown in FIG. 3, conversely, the second diffused layer 103 is fixed to ground potential as a source, the voltage $V_R$ of the first diffused layer 102 which functions as a drain is set to approximately 1.5 V and the voltage $V_{GR}$ of the gate electrode 107 is set to approximately 2.5 V. The silicon substrate 101 is set to ground potential.

Hereby, in the case of logic in which electrons are written in the capture area 109, no current flows between the first diffused layer 102 and the second diffused layer 103. In the meantime, in the case of logic 0 in which no electron is written in the capture area 109, current flows between the first diffused layer 102 and the second diffused layer 103. Hereby, written information can be read.

In a state in which information is held in the MONOS transistor, as shown in FIG. 4, the silicon substrate 101 and the first diffused layer 102 are fixed to ground potential, the voltage $V_H$ of the second diffused layer 103 is set to approximately 1 to 5 V and the voltage $V_{GH}$ of the gate electrode 107 is set to approximately 0 to 6 V. However, in the prior art, as described later, electrons in the capture area 109 in the silicon nitride film 105 drift in the silicon nitride film 105.

Next, for the prior art, referring to FIG. 5, the second conventional type will be described. FIG. 5 is also a schematic sectional view showing an MONOS transistor proposed as a nonvolatile storage cell of a flash memory and the MONOS transistor is characterized in that a word electrode to be a word line and a control gate electrode are formed in structure in which memory cells are arrayed.

As shown in FIG. 5, a first diffused layer 202 and a second diffused layer 203 are formed by an N$^+$-type diffused layer on the major surface of a P-conductive type silicon substrate 201, for example. A first control gate electrode 204, a second control gate electrode 205 and a word electrode 206 are formed over the silicon substrate 201 between the first diffused layer 202 and the second diffused layer 203. Insulating films between the first or second control gate electrode 204, 205 and the silicon substrate 201 are formed by insulating films having ONO structure as in the first conventional type and an insulating film between the word electrode 206 and the silicon substrate 201 is formed by a single-layer silicon oxide film. Further, the first or second control gate electrode 204, 205 and the word electrode 206 are also electrically disconnected by the insulating films having ONO structure.

In such structure, information charge (an electron) is respectively written in capture areas 207, 208 having ONO structure under the first and second control gate electrodes 204, 205. For operation for erasing information charge, voltage is applied between the first control gate electrode 204 and the first diffused layer 202 and between the second control gate electrode 205 and the second diffused layer 203, and a hole generated by tunneling between bands and described in relation to the first conventional type is injected into each capture area 207, 208.

In the nonvolatile storage cell of the first conventional type, to guarantee a specified value of time in which information charge is stored, there is a limit in thinning the first silicon oxide film 104, the silicon nitride film 105 and the second silicon oxide film 106. Currently, the inventor performs various tests and experiments of the basic characteristics of a nonvolatile storage cell having MONOS structure. As a result, it proves that to guarantee the time in which information is stored and held of 10 years, the lower limit of thinning in case insulating films having ONO structure are formed by a silicon oxide film is approximately 8 nm. In a recent flash memory in which speeding up is essential, it has proven that there is a limit in speeding up operation for reading.

Further, in the first conventional type, as described above, electrons written in the capture area 109 of information charge drift in a lateral direction in the silicon nitride film 105, the electric conduction of which is relatively high as shown by arrows in FIG. 4. Therefore, the capture area is expanded as time goes and the holding characteristic of information charge is deteriorated.

The nonvolatile storage cell having MONOS structure is used for a nitride read only memory (NROM) disclosed in the U.S. Pat. No. 5,966,603. In this case, 2-bit information can be written per cell. However, as described above, when the capture area 109 is expanded as time goes, it becomes difficult to read stored information. Particularly, even the slight variation in elapsed time of the capture area has a large effect upon NROM operated based upon multiple values. In this case, the quantity of written electrons is approximately 500 pieces and the capture area for the electrons the width in the lateral direction of which is approximately 10 nm is a very small region.

Besides, in the second conventional type, the MONOS transistor provided with the control gate electrode as described above and the MOS transistor provided with the word electrode are mounted in one memory cell. The control gate electrode is formed by a side wall conductive film formed on the side wall of the word electrode. In such structure, as the dimension in a direction of a channel of the control gate electrode can be reduced, the effective length of the channel is shortened and operation for reading can be speeding up.

However, as described above, the control gate electrode is formed on the side wall of the word electrode. Therefore, in an array of cells, a control gate electrode line and a word electrode line (the word line) are arranged in the same direction. Further, the control gate electrode line and the word electrode line are also arranged in parallel with the bit line formed by the first and second diffused layers. However, the word line and the bit line are required to be arranged perpendicularly in view of relation with a peripheral circuit of a memory cell. In the second conventional type, such a layout is difficult.

Besides, in the second conventional type, as described above, the control gate electrode is formed by the side wall conductive film formed on the side wall of the word electrode. Therefore, the width of the electrode is very narrow, when this is used for wiring, the resistance increases and the delay of transmission increases. From this viewpoint, the application to a memory cell also is difficult.

Further, in the second conventional type, as in the first conventional type, the capture area of information charge is also expanded as time goes and the holding characteristic of information charge is deteriorated.

SUMMARY OF THE INVENTION

The main object of the invention is to enhance the holding characteristic of information charge in a nonvolatile storage cell having MONOS structure. The object is to facilitate increase of the capacitance of a flash memory, the reduction of operating voltage and the speeding-up of operation, to enhance a function or to provide multiple functions. Further, another object of the invention is to facilitate the practical use of a flash memory which can be operated based upon multiple values such as NROM.

According to one feature of the present invention, there is provided a nonvolatile semiconductor memory device which comprises first and second diffused layers of a reverse conductive type formed on the surface of a semiconductor substrate of one conductive type, a channel region between the first and second diffused layers, laminated films formed above the channel region respectively adjacent to the first and second diffused layers and laminated in the order of a first insulating layer as a first film, a second insulating layer or a semiconductor layer as a second film and a third insulating layer as a third film, a fourth insulating layer formed in a location in which the laminated insulating films are not provided on the channel region, a fifth insulating layer formed on the side wall of the second insulating layer or the semiconductor layer of the second film and a gate electrode composed of a first conductive film formed on the fourth insulating film and a second conductive film formed on the laminated films.

A capacitance value per unit area of the fourth insulating layer is larger than a capacitance value per unit area of the laminated films. It is desirable that the laminated films are made of a silicon oxide film as the third insulating layer of the third film, a silicon nitride film as the second insulating layer of the second film or a silicon film as the semiconductor layer of the second film and a silicon oxide film as the first insulating film of the first film, and the fifth insulating layer is formed by a silicon oxide film.

Further, the cross section of the gate electrode composed of the first and second conductive films may be T type. The end of the second conductive film may be overlapped with the first diffused layer or the second diffused layer with the laminated films between them.

Further, the first conductive film and the second conductive film may be different in material. Or, the first conductive film and the second conductive film can be continuously formed. An insulating film is provided between the side wall of the first conductive film and the side wall of the second conductive film.

The laminated films may be formed from the upside of the end of the channel region to the upside of each location adjacent to the channel region of the first and second diffused layers. Or, the laminated films may be formed across each upside of the first and second diffused layers from the upside of the end of the channel region. In this case, the second conductive film may be formed on the laminated films across each upside of the first and second diffused layers.

Further, the gate electrode is connected to a word line of a memory cell and the first diffused layer or the second diffused layer functions as a part of a bit line of the memory cell.

According to further feature of the present invention, there is provided an on volatile semiconductor memory device which comprises first and second diffused layers formed on the surface of a semiconductor substrate with a gate electrode between them, a channel region functions between the first and second diffused layers, a first insulating layer, an isolated substance and a third insulating layer are formed in order on a region adjacent to the first diffused layer or the second diffused layer in the channel region, a fourth insulating layer is formed in a region in which the first insulating layer, the isolated substance and the third insulating layer are not formed on the channel region, and the first insulating layer, the isolated substance, the third insulating layer and the fourth insulating layer are covered with a gate electrode. The first insulating layer and the third insulating layer are made of a silicon oxide film and the isolated substance can be formed by nitride silicon, silicon, silicon germanium or high-melting point metal.

According to another aspect of the present invention, there is provided a method of manufacturing a nonvolatile semiconductor memory device which comprises a process for laminating a first insulating layer as a first film, a second insulating layer or a semiconductor layer as a second film and a third insulating layer as a third film on the surface of a semiconductor substrate in order and forming laminated films, a process for selectively removing the laminated films and exposing the semiconductor substrate, a process for forming a fourth insulating layer on the exposed surface of the semiconductor substrate and forming a fifth insulating layer on the side wall of the exposed second insulating layer or of the exposed semiconductor layer, a process for forming a first conductive film to be the center of a gate electrode on the fourth insulating layer, a process for forming a second conductive film to be the end of the gate electrode on the laminated insulating films and on the side of the first conductive film and a process for doping impurities into the surface of the semiconductor substrate using the first and second conductive films as a mask and forming first and second diffused layers by diffusing them.

In the manufacturing method, the laminated films are made of a silicon oxide film as the third insulating layer of the third film, a silicon nitride film as the second insulating layer of the second film or a silicon film as the semiconductor layer of the second film and a silicon oxide film as the first insulating layer of the first film, and it is desirable that the fifth insulating layer is made of a silicon oxide film. It is desirable that the fourth insulating layer and the fifth insulating layer are formed in the atmosphere of activated oxygen including radical oxygen by thermal oxidation.

The first conductive film is made of polycide using high-melting point metal and the second conductive film may be made of a polycrystalline silicon film including impurities. Or, the first conductive film may be made of a polycrystalline silicon film including impurities and the second conductive film may be made of polycide using high-melting point metal.

Further, the semiconductor substrate can be exposed in a rectangular pattern by selectively removing the laminated films. It is desirable that the second conductive film is formed in two processes and the shape on the side of the channel region of the first and second diffused layers is LDD type by doping impurities after each process. Further, a dummy insulating film provided with a predetermined pattern is formed on the third insulating layer of the laminated films and after a side wall conductive film to be a part of the second conductive film is formed on the sidewall of the dummy insulating film, the laminated films are removed by etching using the dummy insulating film and the side wall conductive film as a mask and the surface of the semiconductor substrate can be exposed.

BRIEF DESCRIPTION OF THE DRAWINGS

FIGS. 26A to 26D are planes in the order of steps succeeding FIG. 25D; and

DETAILED DESCRIPTION OF THE PREFERRED EMBODIMENTS

Next, referring to FIGS. 6 to 13, a first embodiment of the invention will be described.

Figure 6:
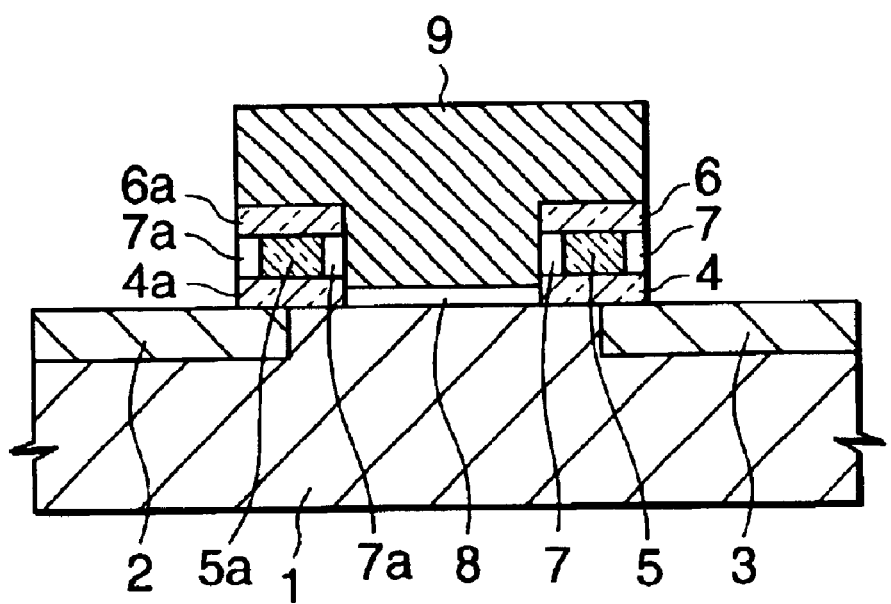
FIG. 6 is a sectional view showing a nonvolatile storage cell for explaining a first embodiment of the present invention.

FIG. 6 is a sectional view showing the basic structure of a nonvolatile storage cell according to the present invention and FIG. 7 are sectional views for explaining the basic operation. FIGS. 8 to 13 are sectional views in the order of steps in a process for explaining two types of concrete manufacturing methods.

As shown in FIG. 6, a first diffused layer 2 and a second diffused layer 3 which are an $N^+$ diffused layer are formed on the major surface of a P-conductive type of silicon substrate 1. Laminated films having ONO structure are or OSO structure partially formed on the major surface of the silicon substrate 1 in each vicinity of the first diffused layer 2 and the second diffused layer 3. That is, as shown in FIG. 6, the laminated film structures are composed of first films 4, 4a, second films 5, 5a and third films 6, 6a.

Each of the first films 4, 4a is a first insulating layer made of a silicon oxide film of approximately 4 nm thickness; each of the second films 5, 5a is a second insulating layer made of a silicon nitride films of approximately 6 nm thickness or made of a semiconductor layer made of a silicon film; and each of the third films 6, 6a is a third insulating layer made of a silicon oxide film of approximately 5 nm thickness.

The laminated films are not formed in the whole channel region of a transistor but are partially formed in an area adjacent to the source/the drain of the transistor.

Further, fifth insulating layers 7 or 7a are formed on the side walls of each second film 5, 5a of silicon nitride film or silicon film. Each of the fifth insulating layers 7, 7a is a silicon oxide film approximately 4 nm thickness. The width in the lateral direction of each second film 5, 5a of silicon nitride film or silicon film is approximately 20 nm.

In most of a channel the length of which is 0.1 to 0.2 $\mu$m, a fourth insulating layer 8 as a gate insulating film 8 which is different from the laminated films having ONO structure or OSO structure is formed. The gate insulating film 8 is formed by a silicon oxide film or a silicon nitride film the thickness of which is approximately 4 to 6 nm.

A gate electrode 9 is formed so that it covers the gate insulating film 8 and the laminated films having ONO structure or OSO structure partially formed. The cross section of the gate electrode 9 is T type. Each end of the gate electrode 9 is overlapped with the first diffused layer 2 and the second diffused layer 3 via the first films 4, 4a, the second films 5, 5a and the third films 6, 6a respectively laminated. The gate electrode 9 is formed by polycrystalline silicon (Si) containing N-type impurities, polycrystalline silicon germanium (SiGe), polycide or polymetal.

Figure 7A:
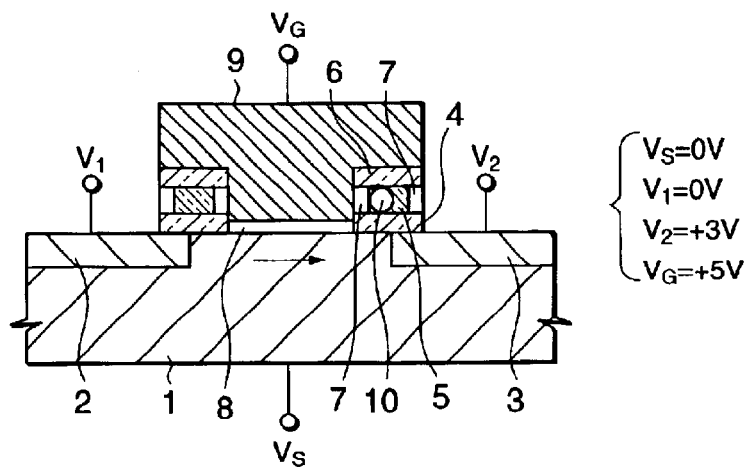
FIGS. 7A to 7C are sectional views for explaining the operation of the nonvolatile storage cell according to the present invention.

Next, the basic operation of the nonvolatile storage cell will be described. For operation for writing information charge, as shown in FIG. 7A, for example, the voltage $V_S$ of the silicon substrate 1 and the voltage $V_1$ of the first diffused layer 2 are set to ground potential (0 V), the voltage $V_2$ of the second diffused layer 3 is set to approximately 3 V and the voltage VG of the gate electrode 9 is set to approximately 5 V. When such voltage is applied, the flow of electrons to be channel current shown by an arrow is generated from the first diffused layer 2 which functions as the source to the second diffused layer 3 which functions as the drain, becomes CHE in the vicinity of the second diffused layer 3 and a part of it is written in a capture area 10 of the second film 5 of silicon nitride film or silicon film beyond the barrier of the first film 4 of silicon oxide film as information charge.

Figure 7B:
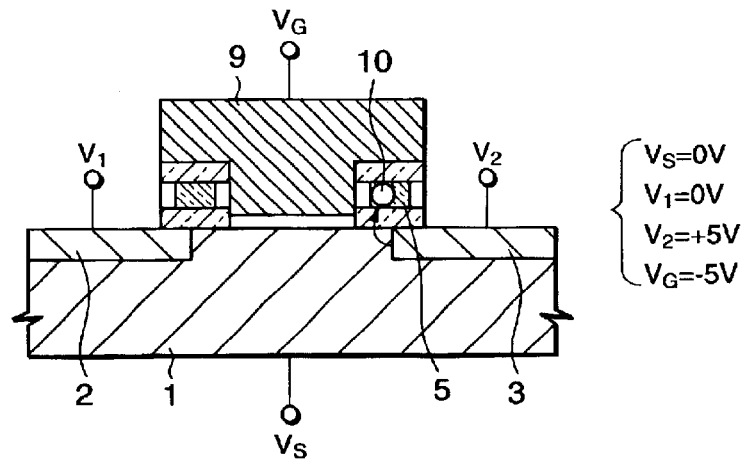

Next, for operation for erasing information, in structure shown in FIG. 7B, for example, the voltage $V_S$ of the silicon substrate 1 and the voltage $V_1$ of the first diffused layer 2 are fixed to ground potential (0 V), the voltage $V_2$ of the second diffused layer 3 is set to 5 V and the voltage $V_G$ of the gate electrode 9 is set to approximately −5 V. When such voltage is applied, a hole generated by tunneling between bands in a region at the end of the second diffused layer 3 and overlapped with the gate electrode 9 is injected into the capture area 10 as shown by an arrow and information charge is erased.

Figure 7C:
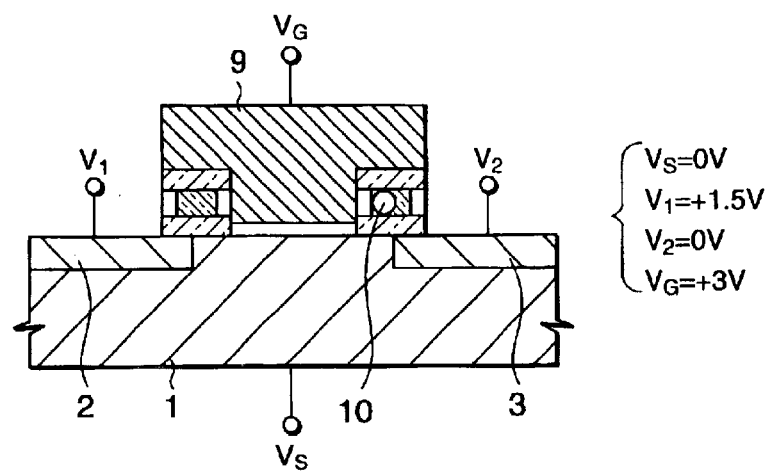

Next, for operation for reading information, as shown in FIG. 7C, the voltage $V_S$ of the silicon substrate land the voltage $V_2$ of the second diffused layer 3 are fixed to ground potential (0 V), the voltage $V_1$ of the first diffused layer 2 which functions as the drain is set to 1.5 V and the voltage $V_G$ of the gate electrode 9 is set to approximately 3 V. In the case of logic 1 in which approximately 500 electrons are written in the capture area 10, no current flows between the first diffused layer 2 and the second diffused layer 3. In the meantime, in the case of logic 0 in which no electron is written in the capture area 10, current flows between the first diffused layer 2 and the second diffused layer 3. Hereby, written information can be read.

In the present invention, as shown in FIG. 6, when the nonvolatile storage cell has the structure described above, the gate insulating film 8 can be thinned independent of the laminated films having ONO structure or OSO structure. That is, the capacitance value per unit area of the gate insulating film 8 can be made larger than the capacitance value per unit area of the laminated films having ONO structure or OSO structure. Operation for reading information is sped up without deteriorating the holding characteristic of information charge which the laminated films having ONO or OSO structure. That is, the speeding-up of the operation and the enhancement of the holding characteristic of information charge can be consistent.

Besides, in the invention, each fifth insulating layer 7, 7a is formed by a silicon oxide film on the side walls of each second film 5, 5a made of a silicon nitride film or a silicon film. The fifth insulating layers 7, 7a respectively inhibit the drift of information charge written in the capture area 10. The reason is that the insulation performance of the silicon oxide film respectively forming the fifth insulating films 7, 7a is higher than that of the silicon nitride film or that of the silicon film respectively forming the second films 5, 5a by approximately $10^3$ to $10^4$ times. Hereby, the holding characteristic of information charge can be greatly enhanced.

Next, the concrete manufacturing method of the nonvolatile storage cell made of an MONOS or MOSOS transistor according to the invention will be described.

Figure 8A:
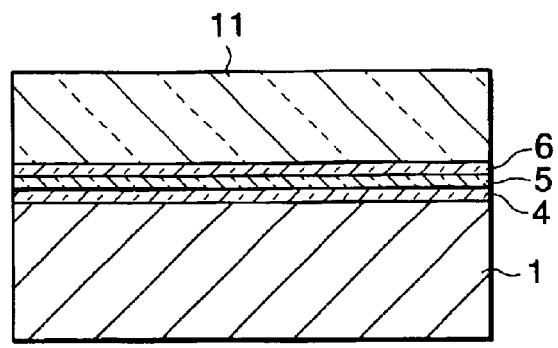
FIGS. 8A to 8C are sectional views in the order of steps in a manufacturing process of the nonvolatile storage cell for explaining the first embodiment of the present invention.

As shown in FIG. 8A, a silicon oxide film having 4 nm thick is formed by the thermal oxidation of the P-conductive type silicon substrate 1 to be the first film 4. Next, a silicon nitride film approximately 6 nm thick or a silicon film is formed on the first film 4 by chemical vapor deposition (CVD) to be the second film 5, further, a silicon oxide film having 4 nm thick is deposited on the second film 5 by CVD to be the third film 6, and a silicon nitride film or an alumina film having the thickness of 200 nm is formed on the silicon oxide film 6 to be a groove formation film 11.

Figure 8B:
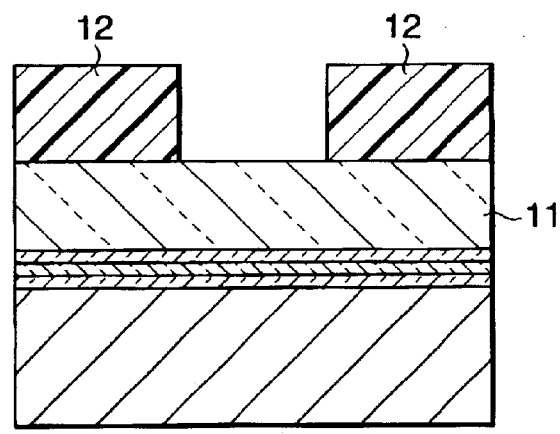

Next, as shown in FIG. 8B, a resist mask 12 having a groove pattern is formed on the groove formation film 11 by well-known lithography.

Figure 8C:
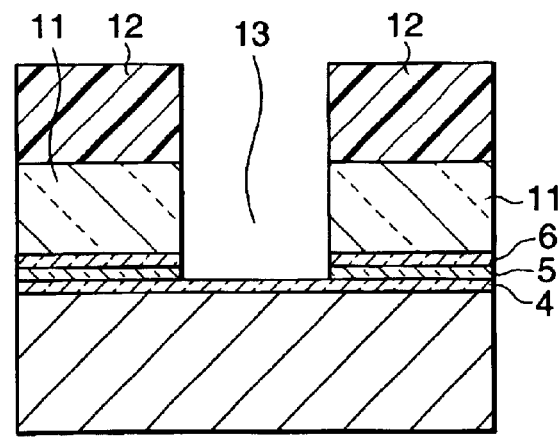

As shown in FIG. 8C, the groove formation film 11, the third film 6 and the second film 5 are sequentially etched by dry etching technique using the resist mask 12 as an etching mask and a groove 13 is formed. Afterward, the first film 4 is removed by wet etching.

Next, in the present invention, thermal oxidation is executed in the atmosphere of radical oxygen using the groove formation film 11 as a mask. In the present invention, in place of radical oxygen, activated oxygen may be also used. The activated oxygen means oxygen in an excited state and includes an oxygen ion and neutral radical oxygen. Such activated oxygen can be generated by activating oxygen in a state of plasma, reacting hydrogen and oxygen under reduced pressure or thermally cracking ozone.

When the thermal oxidation is executed in the atmosphere of radical oxygen, the side walls of each second film 5, 5a made of a silicon nitride film or made of a silicon film are easily oxidized and a silicon oxide film is formed in a region described above.

Figure 9A:
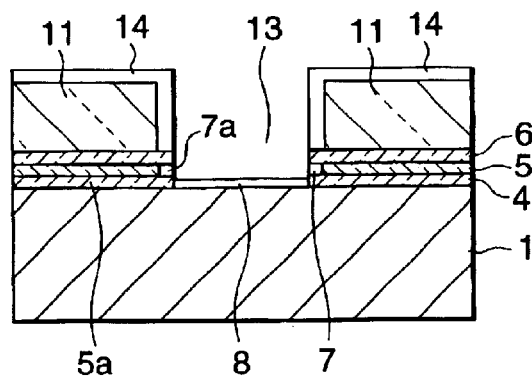
FIGS. 9A to 9C are sectional views in the order of steps succeeding FIG. 8C.

Hereby, as shown in FIG. 9A, each fifth insulating layer 7, 7a of silicon oxide film is formed on the side walls of each second film 5, 5a made of a silicon nitride film or made of a silicon film. The surface of the groove formation film 11 similarly made of a silicon nitride film is also thermally oxidized and a side oxide film 14 is formed. Simultaneously, the surface of the silicon substrate 1 is also thermally oxidized and a fourth insulating layer 8 as a gate insulating film 8 is formed on the surface in a groove 13 of the silicon substrate 1. The thickness of the gate insulating film 8 is approximately 5 nm thickness and is thinner than the effective thickness of the laminated films structure composed of the first film 4, the second film 5 and the third film 6. When the groove formation film 11 is formed by an alumina film, the side oxide film 14 described above is not formed.

The silicon nitride film is easily oxidized at the low temperature of approximately 700° C. in so-called radical oxidation. When the gate insulating film 8 is formed by radical oxidation as described above, hole traps in the film decrease and frequencies for writing and erasing information to/from the nonvolatile storage cell can be increased.

Figure 9B:
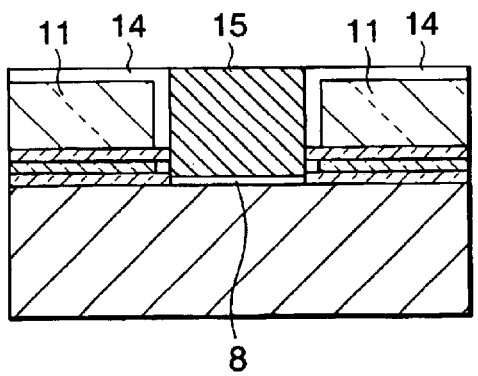

Next, to cover the gate insulating film 8 and fill the groove 13, a tungsten polycide film which is a first conductive film is formed and an unnecessary part is removed by chemimechanical polishing (CMP) or dry etching using the side oxide film 14 or the groove formation film 11 as a stopper of polishing. Hereby, a buried conductive film 15 shown in FIG. 9B is formed.

Figure 9C:
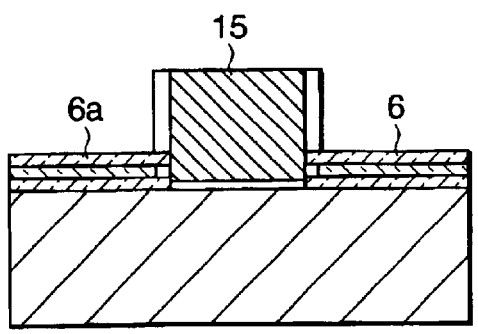

Next, as shown in FIG. 9C, the side oxide film 14 and the formation film groove 11 are removed by wet etching. Hereby, the buried conductive film 15 protruded above the third insulating films 6, 6a is formed. The buried conductive film 15 is worked in a predetermined pattern.

Figure 10A:
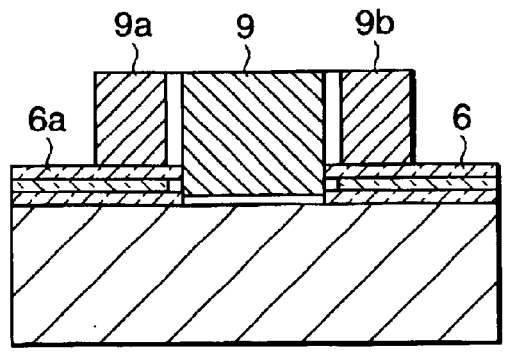
FIGS. 10A to 10C are sectional views in the order of steps succeeding FIG. 9C.

Next, as a second conductive film, a polycrystalline silicon film the thickness of which is approximately 200 nm and which includes N-type impurities is deposited overall. The etching back of the polycrystalline silicon film is executed and as shown in FIG. 10A, a first gate electrode end 9a and a second gate electrode end 9b are formed on the respective side walls of the gate electrode 9 of the buried conductive film 15 as a side wall conductive film.

Figure 10B:
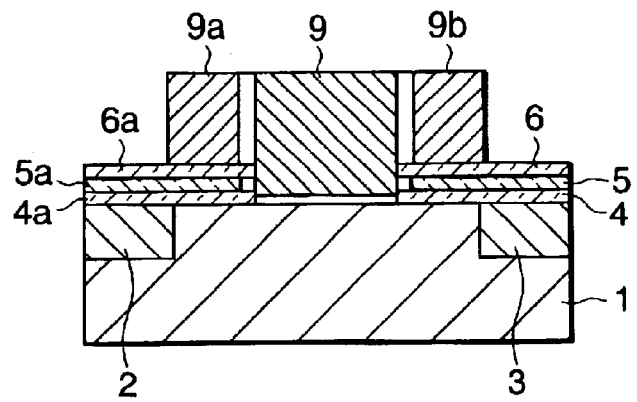

Next, as shown in FIG. 10B, the first diffused layer 2 and the second diffused layer 3 are formed on the surface of the silicon substrate 1 by implanting an arsenic ion though each first insulating film 4, 4a, each second insulating film 5, 5a and each third insulating film 6, 6a using the gate electrode 9, the first gate electrode end 9a and the second gate electrode end 9b as a mask.

Figure 10C:
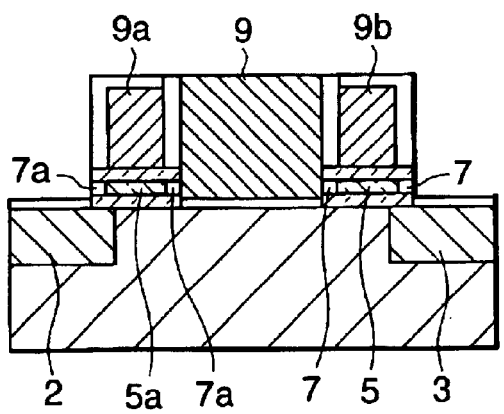

Next, impurities in the first diffused layer 2 and the second diffused layer 3 are diffused by heat treatment and as shown in FIG. 10C, the first gate electrode end 9a and the second gate electrode end 9b are overlapped with the first diffused layer 2 and the second diffused layer 3 via each laminated insulating films including each first insulating film 4, 4a, each second insulating film 5, 5a and each third insulating film 6, 6a.

Next, each third insulating film 6, 6a, each second insulating film 5, 5a and each first insulating film 4, 4a are sequentially etched and removed using the gate electrode 9, the first gate electrode end 9a and the second gate electrode end 9b as a mask. Again, as described above, thermal oxidation is executed in the atmosphere of radical oxygen. Hereby, as shown in FIG. 10C, a fourth insulating film 7, 7a is formed on the side walls at each end of each second insulating film 5, 5a on the sides of the first diffused layer 2 and the second diffused layer 3. In the thermal oxidation, a side oxide film is also formed on each surface of the gate electrode 9, the first gate electrode end 9a, the second gate electrode end 9b, the first and second diffused layers 2, 3. Then, when such a side oxide film is removed, a nonvolatile storage cell having the similar structure to that described in relation to FIG. 6 is formed.

Next, referring to FIGS. 11 to 13, another manufacturing method of the nonvolatile storage cell according to the invention will be described.

Figure 11A:
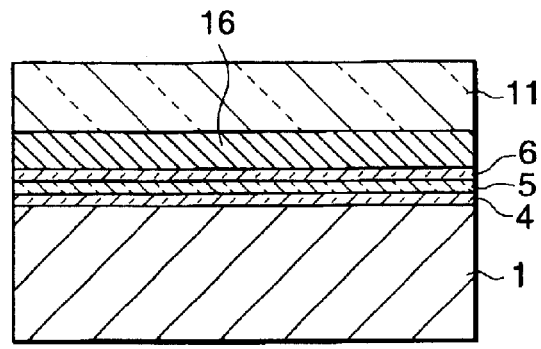
FIGS. 11A to 11C are sectional views in the order of steps in another manufacturing process of a nonvolatile storage cell for explaining the first embodiment of the present invention.

As shown in FIG. 11A, the first film 4 made of a silicon oxide film, a second film 5 made of a silicon nitride film or made of a silicon film, and a third film 6 of a silicon oxide film are formed on a silicon substrate 1 by the similar process to that described in relation to FIG. 8A, and a polycrystalline silicon layer 16 containing N-type impurities is deposited on the third film. The thickness of the polycrystalline silicon layer 16 is approximately 50 nm. Further, a silicon nitride film 11 having 150 nm thick is formed on the polycrystalline silicon layer 16 as a groove formation film 11. In place of the polycrystalline silicon layer, an amorphous silicon layer may be also formed. The groove formation film 11 may be also formed by an alumina film.

Figure 1:
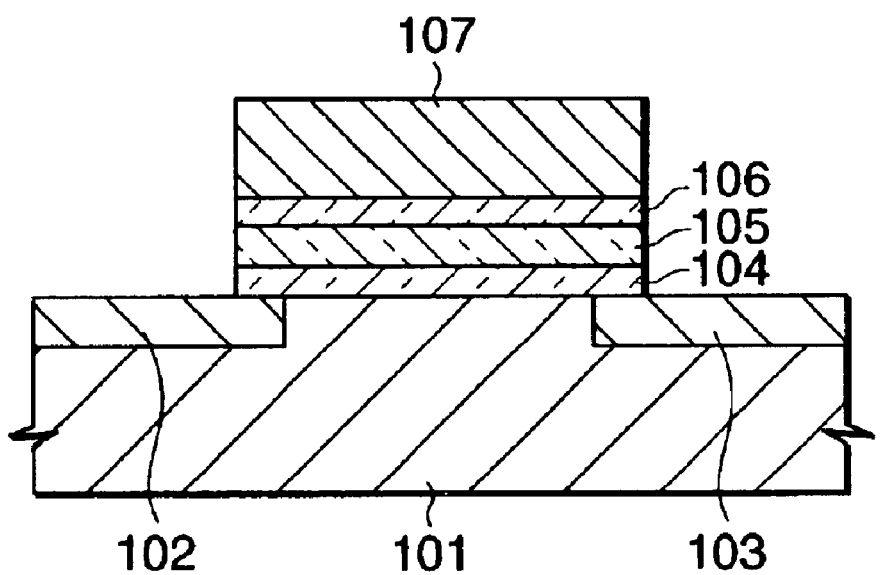
FIG. 1 is a sectional view showing a nonvolatile storage cell for explaining a first conventional type.
Figure 2A:
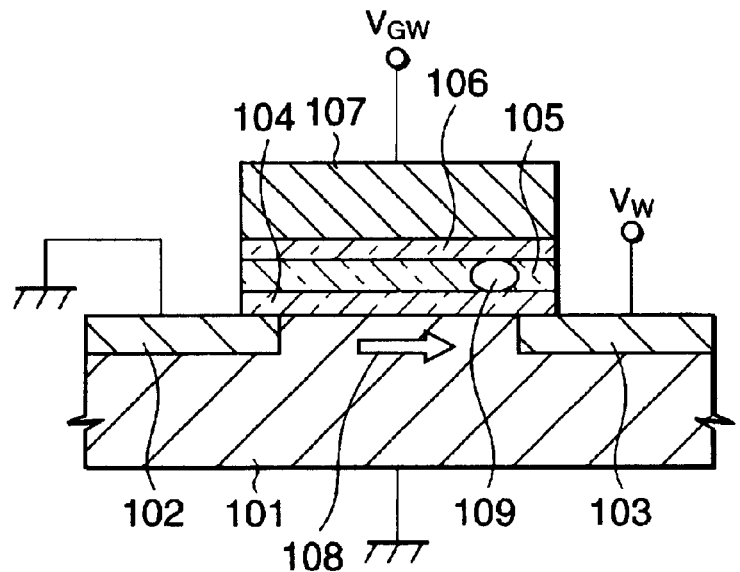
FIGS. 2A and 2B are sectional views for explaining the operation of the first conventional type of nonvolatile storage cell.
Figure 2B:
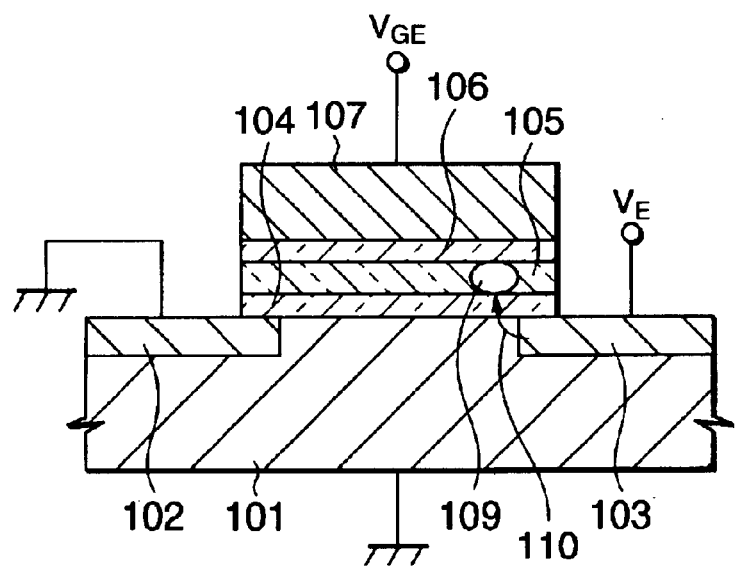
Figure 3:
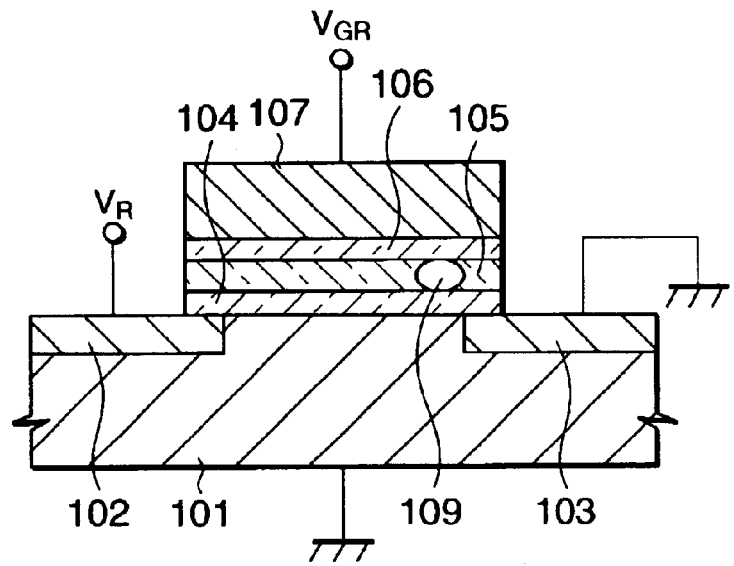
FIG. 3 is a sectional view for explaining the operation of the first conventional type of nonvolatile storage cell.
Figure 4:
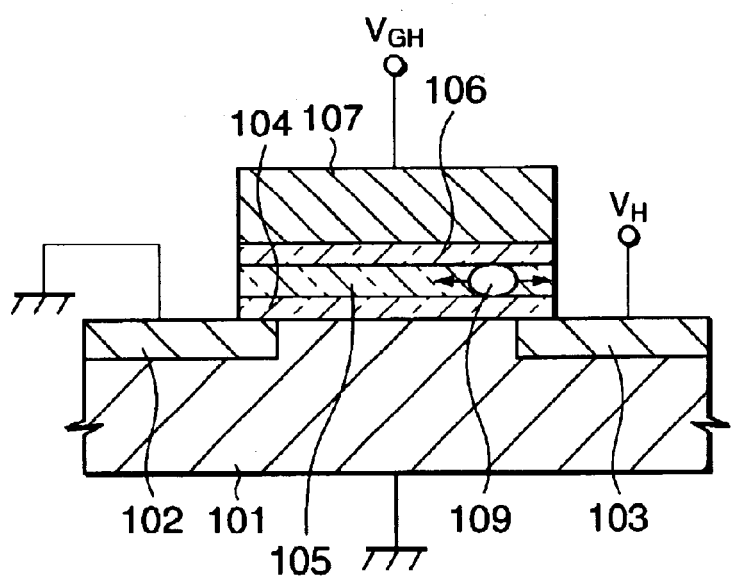
FIG. 4 is a sectional view for explaining the problem of the first conventional type.
Figure 5:
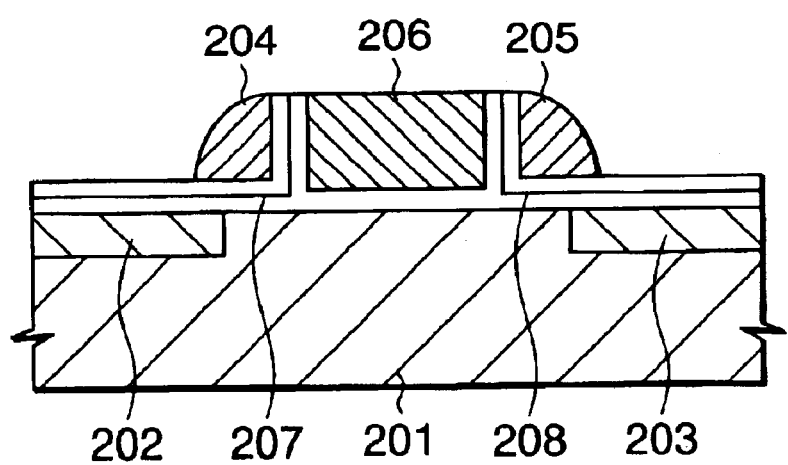
FIG. 5 is a sectional view showing a nonvolatile storage cell for explaining a second conventional type.
Figure 11B:
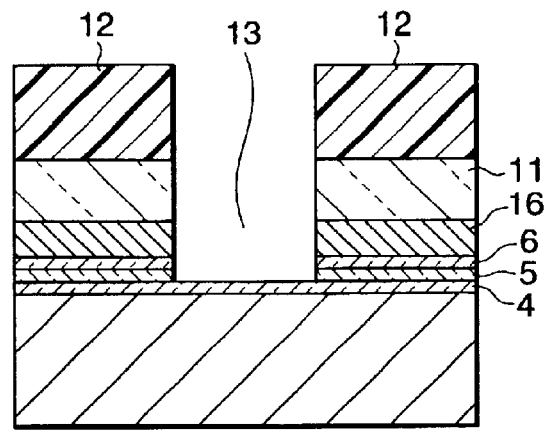
Figure 11C:
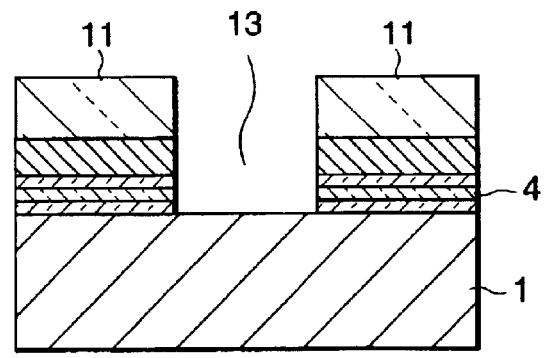

Next, as shown in FIG. 11B, the groove formation film 11 the polycrystalline silicon layer 16, the third film 6 and the second film 2 are sequentially etched using a resist mask 12 having a groove pattern by well-known dry etching technique and a groove 13 is formed. Afterward, as shown in FIG. 1C, the first film 4 is removed by wet etching using the groove formation film 11 as an etching mask and the surface in the groove 13 of the silicon substrate 1 is exposed.

Figure 12A:
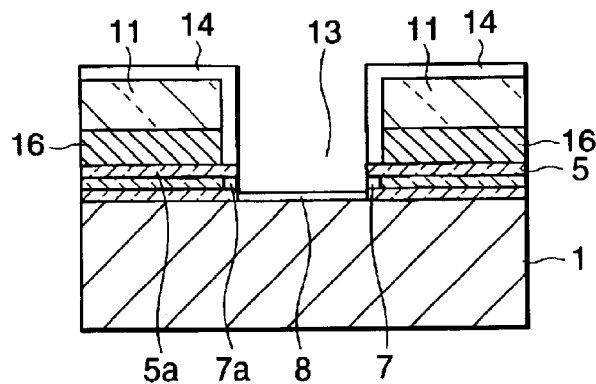
FIGS. 12A to 12C are sectional views in the order of steps succeeding FIG. 11C.

Next, thermal oxidation in the atmosphere of radical oxygen using the groove formation film 11 as a mask is executed as described in relation to FIG. 9A. When thermal oxidation is executed in the atmosphere of radical oxygen, the respective side walls of second films 5, 5a made of a silicon nitride film or made of a silicon film are easily oxidized and a silicon oxide film is formed in a region described above. Hereby, as shown in FIG. 12A, the second 5, 5a made of a silicon nitride film or made of silicon film are thermally oxidized and a fifth insulating layer 7, 7a is formed on the side walls of each. The surface of the groove formation film 11 similarly made of a silicon nitride film and the side wall of the polycrystalline silicon layer 16 are also thermally oxidized and a side oxide film 14 is formed. The surface of the silicon substrate 1 is also thermally oxidized and a fourth insulating layer 8 as a gate insulating film 8 is formed on the surface in the groove 13 of the silicon substrate 1.

Figure 12B:
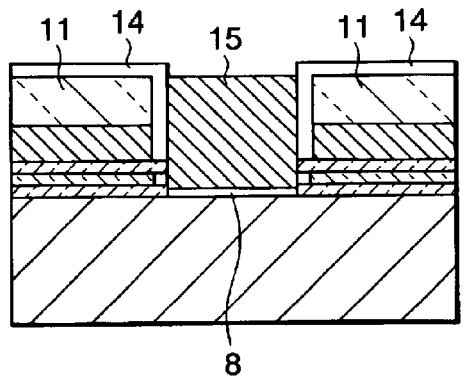

Next, as shown in FIG. 12B, a buried conductive film 15 for covering the gate insulating film 8 is formed by CMP using the side oxide film 14 or the insulating film for a groove 11 as a stopper of polishing.

Figure 12C:
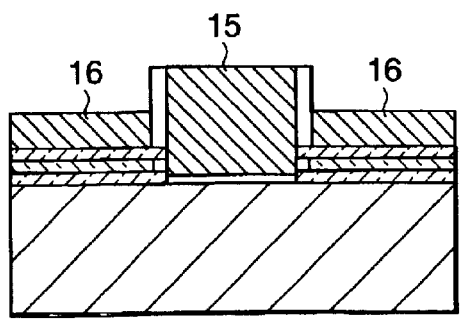

Next, as shown in FIG. 12C, the side oxide film 14 and the groove formation film 11 are removed by dry etching and the buried conductive film 15 protruded above the polycrystalline silicon layer 16 is formed. The buried conductive film 15 is worked in a predetermined pattern.

Figure 13A:
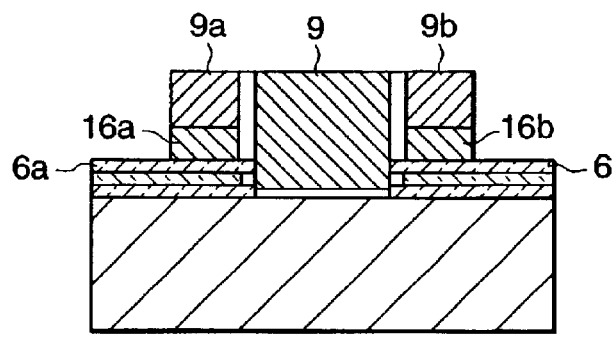
FIGS. 13A to 13C are sectional views in the order of steps succeeding FIG. 12C.

Next, a tungsten film approximately 150 nm thick is deposited overall. As shown in FIG. 13A, a first gate electrode end 9a and a second gate electrode end 9b are formed on the respective side walls of a gate electrode 9 by the etching-back of the tungsten film and the dry etching of the polycrystalline silicon layer 16 and polycrystalline silicon layers 16a, 16b simultaneously patterned are formed. Third insulating films 6, 6a function as a stopper of etching.

Figure 13B:
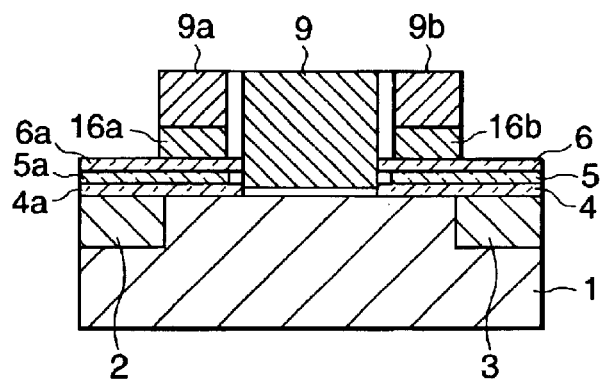

Next, as shown in FIG. 13B, an arsenic ion is implanted through each first film 4, 4a, each insulating film 5, 5a and each third film 6, 6a using the gate electrode 9, the first gate electrode end 9a and the second gate electrode end 9b as a mask, and a first diffused layer 2 and a second diffused layer 3 are formed on the surface of the silicon substrate 1.

Figure 13C:
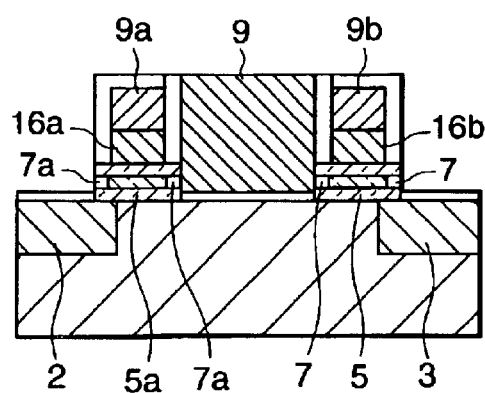

Next, impurities in the first diffused layer 2 and the second diffused layer 3 are diffused by heat treatment and as shown in FIG. 13C, a group of the first gate electrode end 9a and a polycrystalline silicon layer 16a and a group of the second gate electrode end 9b and a polycrystalline silicon layer 16b are overlapped with the first diffused layer 2 and the second diffused layer 3 via each laminated insulating films including each first insulating film 4, 4a, each second insulating film 5, 5a and each third insulating film 6, 6a.

Next, each third film 6, 6a, each second film 5, 5a and each first film 4, 4a are sequentially etched and removed using the gate electrode 9 of the buried conductive film 15, the first gate electrode end 9a and the second gate electrode end 9b as a mask. Again, as described above, thermal oxidation is executed in the atmosphere of radical oxygen. Hereby, as shown in FIG. 13C, a fourth insulating film 7, 7a is formed on the sides walls at each end of each second film 5, 5a on the sides of the first diffused layer 2 and the second diffused layer 3. In the thermal oxidation, a side oxide film is also formed on each surface of the gate electrode 9, the first gate electrode end 9a and the second gate electrode end 9b or the first and second diffused layers 2, 3. Then, when such a side oxide film is removed, a nonvolatile storage cell having the similar structure to that described in relation to FIG. 6 is formed.

In the manufacturing method of the nonvolatile storage cell, the polycrystalline silicon layer 16 or 16a or 16b is formed on the laminated insulating films having ONO structure or OSO structure. The polycrystalline silicon layer is provided with a function for protecting the laminated films having ONO structure or OSO structure from damage and others in the process. Therefore, according to the invention, the reliable nonvolatile storage cell can be easily formed.

Figure 14:
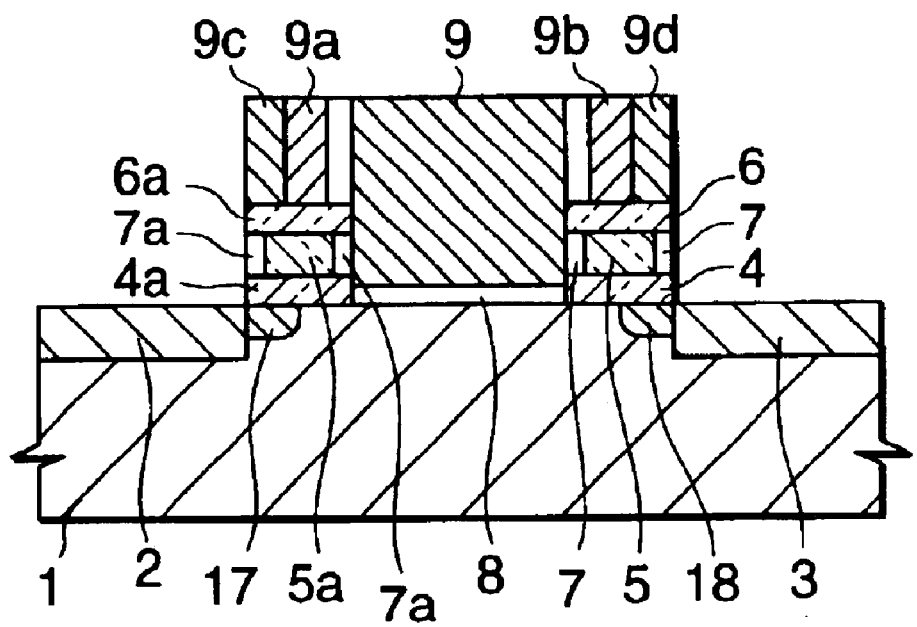
FIG. 14 is a sectional view showing a nonvolatile storage cell for explaining a second embodiment of the present invention.

Next, referring to FIGS. 14 and 15, a second embodiment of the present invention will be described. FIG. 14 is a sectional view showing the basic structure of a nonvolatile storage cell according to the invention used for a flash memory. FIG. 15 are sectional views in the order of steps in a process for explaining the manufacturing method.

The nonvolatile storage cell equivalent to the second embodiment is characterized in that double ends made of conductive material are formed on the side walls of a gate electrode 9 and further, an extension area is provided to a diffused layer.

As shown in FIG. 14, a first diffused layer 2 and a second diffused layer 3 are formed on the main surface of a silicon substrate 1, and a first extension area 17 and a second extension area 18 respectively connected to the first diffused layer 2 and the second diffused layer 3 are formed to be LDD-type structure.

Each first insulating layer 4, 4a of the first film, each second insulating layer 5, 5a or each semiconductor layer 5, 5a of the second film, and each third insulating layer 6, 6a of the third film are laminated and are partially formed on the major surface of the silicon substrate 1 in each vicinity of the first extension area 17 and the second extension area 18. Further, a fifth insulating layer 7, 7a is formed on the respective side walls of each second insulating layer 5, 5a or on the respective side walls of each semiconductor layer 5, 5a. The first insulating layer 4, 4a is made of a silicon oxide film approximately 4 nm thick, the second insulating layer 5, 5a is made of a silicon nitride film approximately 6 nm thick or made of a silicon film, the third insulating layer 6, 6a is made of a silicon oxide film approximately 5 nm thick and the fifth insulating layer 7, 7a is made of a silicon oxide film approximately 4 nm thick.

A gate insulating film 8, that is, a fourth insulating layer different from the laminated films having ONO structure or OSO structure is formed in most of a channel, a gate electrode 9 is formed on the gate insulating film 8 and further, a first gate electrode end 9a, a second gate electrode end 9b, a third gate electrode end 9c and a fourth gate electrode end 9d are formed so that they cover the laminated films having ONO structure or OSO structure. The third gate electrode end 9c and the fourth gate electrode end 9d are overlapped with the first extension area 17 and the second extension area 18 with each first insulating layer 4, 4a, each second insulating layer 5, 5a or each semiconductor layer 5, 5a, and each third insulating layer 6, 6a respectively laminated between them. The gate electrode 9 is made of polycide, polymetal or others, and the first gate electrode end 9a, the second gate electrode end 9b, the third gate electrode end 9c and the fourth gate electrode end 9d are made of polycrystalline Si or polycrystalline SiGe containing N-type impurities.

In the second embodiment, the same effect as the effect described in the first embodiment is also produced. Further, when the diffused layer is provided with the extension area as described above, withstand voltage against punch through between the source and the drain is increased, a hole is easily generated by tunneling between bands and operation for erasing information charge from a flash memory is sped up.

Figure 15A:
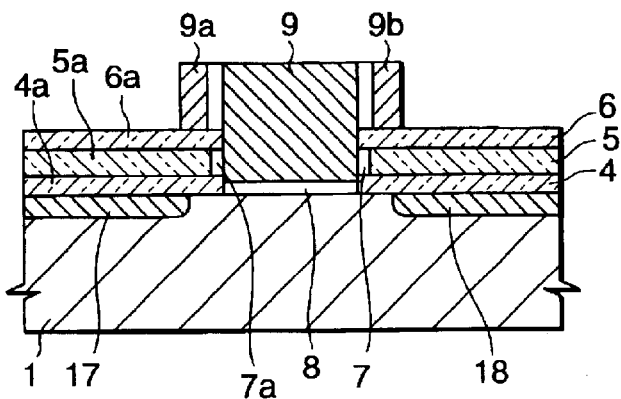
FIGS. 15A to 15C are sectional views in the order of steps in a manufacturing process of the nonvolatile storage cell for explaining the second embodiment of the present invention.

A method of manufacturing the nonvolatile storage cell equivalent to the second embodiment is as follows. That is, the steps which have been described as far as FIG. 10B in the first embodiment are the same as those in the second embodiment. That is, as shown in FIG. 15A, each first insulating layer 4, 4a, each second insulating layer 5, 5a or each semiconductor layer 5, 5a, and each third insulating layer 6, 6a are formed on the silicon substrate 1 and the gate electrode 9 is formed on the gate insulating film 8. The polycrystalline silicon film approximately 200 nm thick is deposited overall, the etching-back of the polycrystalline silicon film is executed, and the first gate electrode end 9a and the second gate electrode end 9b are formed on the side walls of the gate electrode 9. Each third insulating layer 6, 6a functions as a stopper of etching.

As shown in FIG. 15A, an arsenic ion is implanted through each first insulating layer 4, 4a, each second insulating layer 5, 5a or each semiconductor layer 5, 5a, and each third insulating layer 6, 6a using the gate electrode 9, the first gate electrode end 9a and the second gate electrode end 9b as a mask, and the first extension area 17 and the second extension area 18 are formed on the surface of the silicon substrate 1.

Figure 15B:
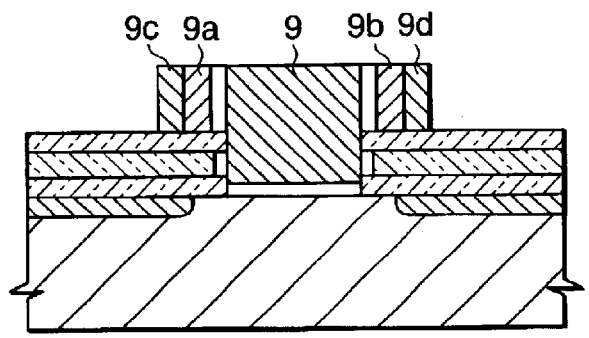

Next, again, the polycrystalline silicon film approximately 200 nm thick is deposited overall and the etching-back of it is executed. Hereby, as shown in FIG. 15B, the third gate electrode end 9c is formed on the side wall of the first gate electrode end 9a and the fourth gate electrode end 9d is formed on the side wall of the second gate electrode end 9b.

Figure 15C:
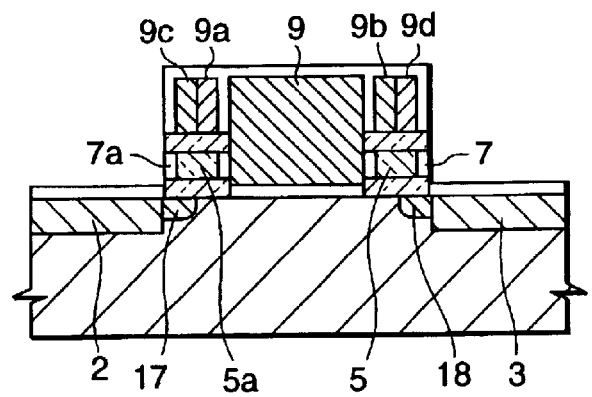

Next, as shown in FIG. 15C, an arsenic ion is implanted through each first insulating layer 4, 4a, each second insulating layer 5, 5a or each semiconductor layer 5, 5a, and each third insulating layer 6, 6a using the gate electrode 9, the first gate electrode end 9a, the second gate electrode end 9b, the third gate electrode end 9c and the fourth gate electrode end 9d as a mask, and the first diffused layer 2 and the second diffused layer 3 are formed on the surface of the silicon substrate 1. The first diffused layer 2 and the second diffused layer 3 are electrically connected to the first extension area 17 and the second extension area 18. Hereby, the nonvolatile storage cell having the basic structure described in relation to FIG. 14 is completed.

Figure 16:
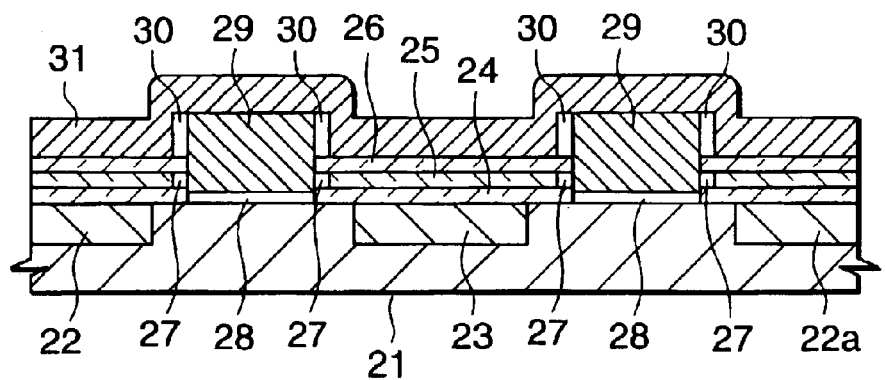
FIG. 16 is a sectional view showing a nonvolatile storage cell for explaining a third embodiment of the present invention.

Next, referring to FIGS. 16 to 19, a third embodiment of the invention will be described. FIG. 16 is a sectional view showing a nonvolatile storage cell applied to a flash memory cell. FIGS. 17 and 18 are sectional views in the order of steps in a process for explaining its manufacturing method. FIG. 19 are plans in the order of steps in the process in case the nonvolatile storage cell is applied to a flash memory cell.

As shown in FIG. 16, to form two memory cells, each first diffused layer 22, 22a and a second diffused layer 23 are formed on the major surface of a P-conductive type silicon substrate 21 by an $N^+$-type diffused layer. These diffused layers function as a bit line of a memory cell. A first insulating layer 24, a second insulating layer 25 and a third insulating layer 26 are formed on the major surface in the vicinity of each first diffused layer 22, 22a or the second diffused layer 23 of the silicon substrate 21 not overall in a channel region of a transistor but in a region adjacent to the source/the drain of the transistor. In most of a channel, a gate insulating film 28 different from the laminated insulating films having ONO structure is formed. The gate insulating film 28, that is, the fourth insulating layer is made of a silicon oxide film.

A gate electrode 29 is formed so that it covers only the gate insulating film 28. The gate electrode 29 is made of polycrystalline silicon containing N-type impurities. A word line 31 is electrically connected to the gate electrode 29 and is arranged so that the word line is perpendicular to the diffused layer which functions as a bit line. The word line 31 covers the laminated insulating films having ONO structure and further, is overlapped with the diffused layer via the laminated insulating films between them. The word line 31 is made of a high-melting point metallic film or a high-melting point polycide film.

In this case, as described in the first and second embodiments, the holding characteristic of information charge stored in the memory cell is also greatly enhanced. Further, the operation of the flash memory, particularly operation for reading stored information is sped up and the reduction of voltage is promoted.

Next, a manufacturing method of the nonvolatile storage cell applied to the memory cell will be described. The manufacturing method is substantially similar to that described in the first embodiment, however, the details will be described below.

Figure 17A:
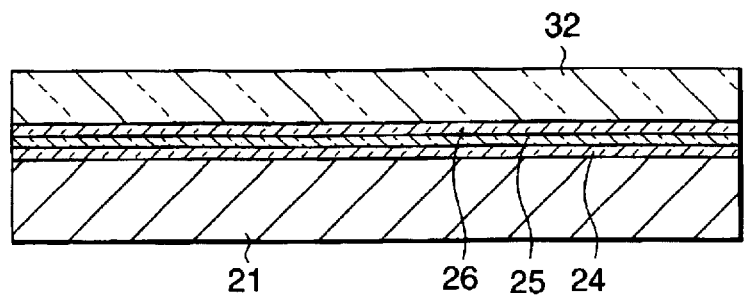
FIGS. 17A to 17D are sectional views in the order of steps in a manufacturing process of the nonvolatile storage cell for explaining the third embodiment of the present invention.

As shown in FIG. 17A, the first insulating layer 24 is formed by the thermal oxidation of the silicon substrate 21, a silicon nitride film to be the second insulating layer 25 is formed by CVD and further, the third insulating layer 26 is formed by the thermal oxidation of the second insulating layer 25 in the atmosphere of radical oxygen. Afterward, a silicon nitride film or an alumina film having the thickness of 50 nm to be a groove formation film 32 is formed on the third insulating layer 26.

Figure 17B:
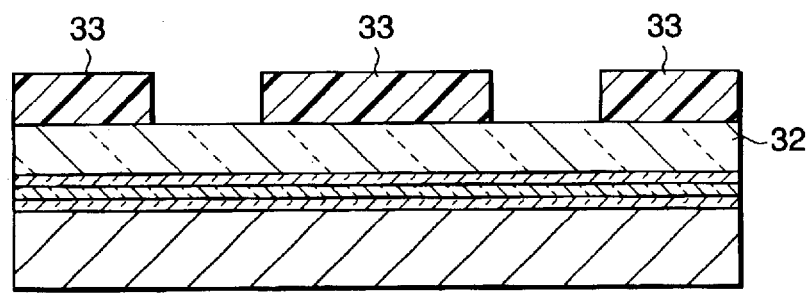
Figure 17C:
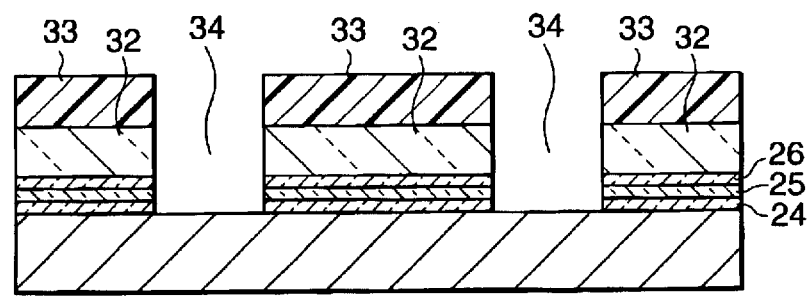

Next, as shown in FIG. 17B, a resist mask 33 having a groove pattern is formed on the groove formation film 32 by well-known lithography. As shown in FIG. 17C, the groove formation film 32, the third insulating layer 26 and the second insulating layer 25 are sequentially etched and a groove 34 having a rectangular pattern is formed. Afterward, the first insulating film 24 is removed by wet etching.

Figure 17D:
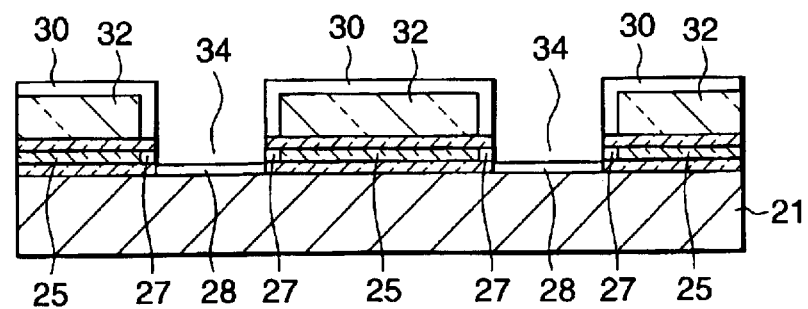

Next, thermal oxidation is executed in the atmosphere of radical oxygen using the groove formation film 32 as a mask. In this case, in place of radical oxygen, activated oxygen may be also used. When the thermal oxidation is executed in the atmosphere of radical oxygen, the side wall of the second insulating layer 25 made of a silicon nitride film is easily oxidized and a silicon oxide film is formed in a region described above. Hereby, as shown in FIG. 17D, the second insulating layer 25 made of the silicon nitride film is thermally oxidized and a fifth insulating layer 27 is formed on the side wall. The surface of the groove formation film 32 similarly made of a silicon nitride film is also thermally oxidized and a side oxide film 30 is formed. Simultaneously, the surface of the silicon substrate 21 is also thermally oxidized and the gate insulating film 28 is formed on the surface in the groove 34 of the silicon substrate 21. The gate insulating film 28 of the fourth insulating layer is approximately 5 nm thick and is thinner than the effective thickness of the laminated insulating films composed of the first insulating layer 24, the second insulating layer 25 and the third insulating layer 26.

Next, a polycrystalline silicon film containing N-type impurities is formed as a first conductive film so that the film covers the gate insulating film 28 and fills the groove 34 and an unnecessary part is removed by CMP using the insulating film for a groove 32 as a stopper of polishing. Hereby, a buried conductive film 35 shown in FIG. 18A as a gate electrode having the rectangular pattern is formed. The buried conductive film 35 is approximately 50 nm thick.

Figure 18A:
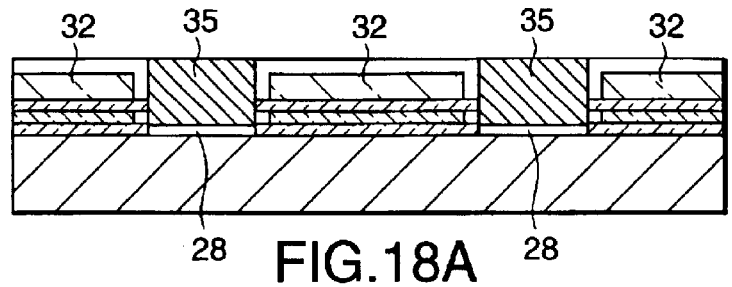
FIGS. 18A to 18D are sectional views in the order of steps in the manufacturing process succeeding FIG. 17D.
Figure 18B:
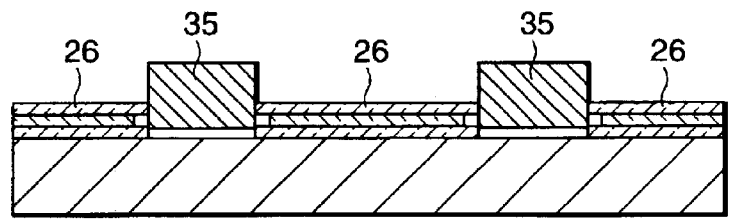

Next, as shown in FIG. 18B, the groove formation film 32 is removed by wet etching. Hereby, the buried conductive film 35 protruded above the third insulating layer 26 is formed.

Figure 18C:
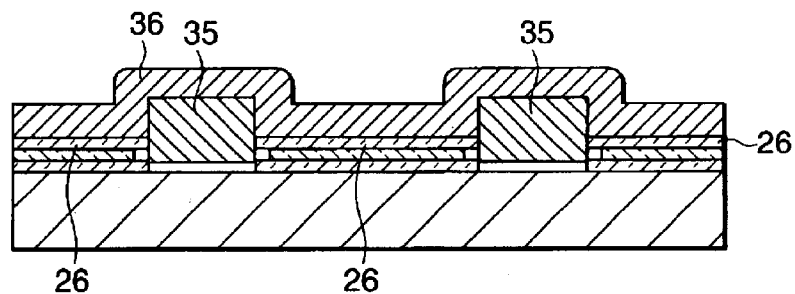

Next, as shown in FIG. 18C, a conductor film 36 made of a tungsten film and others and having the thickness of approximately 200 nm is deposited overall as a second conductive film so that the conductor film covers the buried conductive film 35 and the third insulating film 26.

Figure 18D:
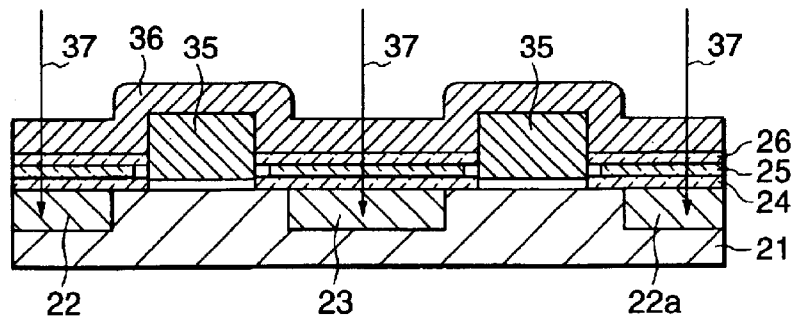

Next, as shown in FIG. 18D, an arsenic ion 37 is implanted using the buried conductive film 35 as a mask. The energy of ion implantation is suitably selected and as shown in FIG. 18D, the first diffused layers 22, 22a and the second diffused layer 23 are formed on the surface of the silicon substrate 21 by the implantation of an arsenic ion through the first insulating layer 24, the second insulating layer 25 and the third insulating layer 26. No arsenic ion is implanted onto the surface of the silicon substrate 21 under the buried conductive film 35 and the conductor film 36 on the side wall by the ion implantation.

Next, the word line 31 described in relation to FIG. 16 is formed by working the conductor film 36 and the buried conductive film 35 by lithography and dry etching technique and simultaneously, the gate electrode 29 by the buried conductive film 35 is formed. Hereby, the nonvolatile storage cell having the structure described in relation to FIG. 16 is completed.

Next, the manufacturing method of the nonvolatile storage cell applied to the memory cell will be schematically described in its plans.

Figure 19A:
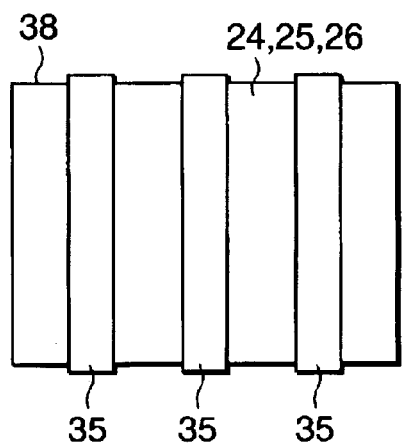
FIGS. 19A to 19D are plans in the order of steps in the manufacturing process of the nonvolatile storage cell for explaining the third embodiment of the present invention.

As shown in FIG. 19A, after a P-conductive type well layer 38 is formed, the first insulating layer 24, the second insulating layer 25, the third insulating layer 26 and the buried conductive film 35 are formed in the step described in relation to FIG. 18B.

Figure 19B:
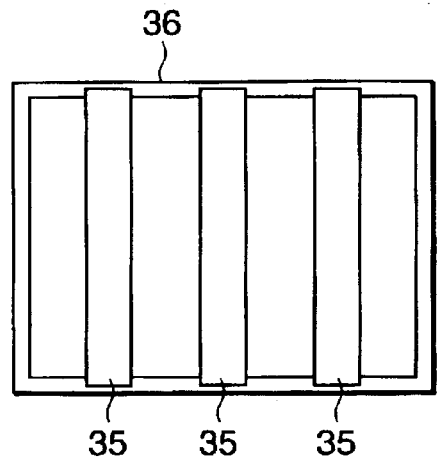

Next, in a step shown in FIG. 19B, the conductor film 36 is formed overall so that the conductor film covers the buried conductive film 35 and others. The step corresponds to the step shown in FIG. 18C.

Figure 19C:
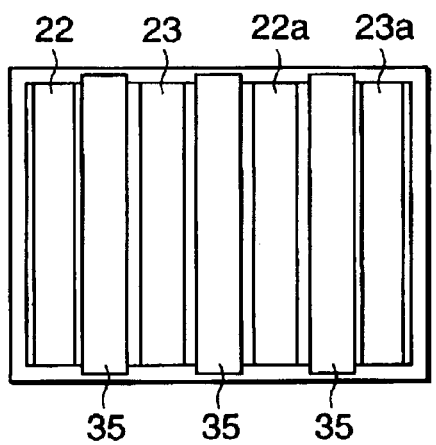

Next, as shown in FIG. 19C, the implantation of an arsenic ion and heat treatment are executed overall, and the first diffused layers 22, 22a and the second diffused layers 23, 23a are formed so that they are parallel to each buried conductive film 35. The step corresponds to the step shown in FIG. 18D.

Figure 19D:
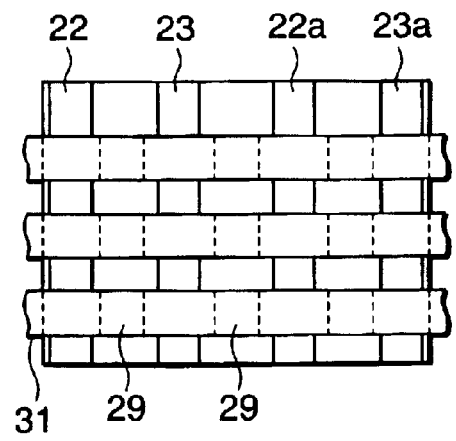

Next, as shown in FIG. 19D, the word line 31 is formed by working the conductor film 36 and the buried conductive film 35 and simultaneously, the gate electrode 29 is formed. Hereby, a bit line formed by each first diffused layer 22, 22a and each second diffused layer 23, 23a and each word line 31 are perpendicularly arranged.

Next, referring to FIG. 20, a fourth embodiment of the present invention will be described. FIG. 20 are also sectional views in the order of steps in a process of a nonvolatile storage cell applied to a flash memory cell. The structure of the nonvolatile storage cell is different from the structure shown in FIG. 16 in that a thick insulating film 39 is formed between a first or second diffused layer 22, 22a (23) to be a bit line of the memory cell and a word line 3l. Hereby, parasitic capacity between the bit line and the word line is greatly reduced. The same reference number is allocated to the same component as that in the third embodiment. The structure of the nonvolatile storage cell according to the present invention is shown in the description of the manufacturing method.

Figure 20A:
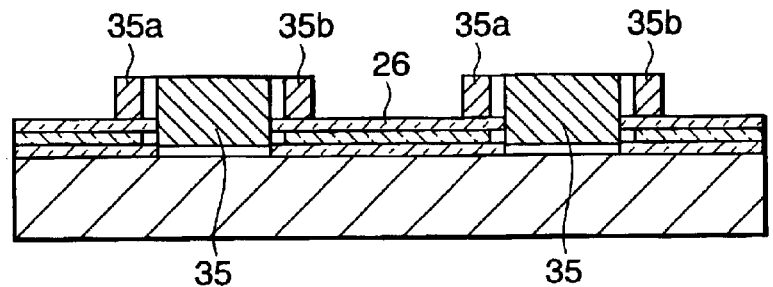
FIGS. 20A to 20C are sectional views in the order of steps in a manufacturing process of a nonvolatile storage cell for explaining a fourth embodiment of the present invention.

The substantially same steps are repeated as far as the step shown in FIG. 18B described in the third embodiment. As shown in FIG. 20A, the groove formation film is removed by wet etching and a buried conductive film 35 protruded above a third insulating layer 26 is formed.

Next, a polycrystalline silicon film containing phosphoric impurities and having the thickness of approximately 100 nm is deposited overall. The etching-back of the polycrystalline silicon film is executed and as shown in FIG. 20A, a first rectangular conductive film 35a and a second rectangular conductive film 35b are formed on the side walls of the buried conductive film 35 as a side wall conductive film.

Figure 20B:
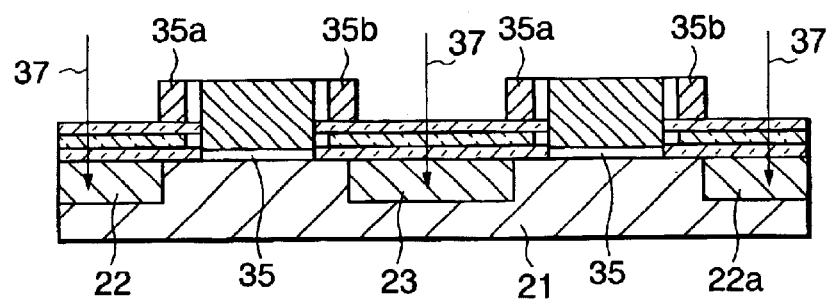

Next, as shown in FIG. 20B, an arsenic ion 37 is implanted through the laminated films composed of each first film, each second film and each third film using the buried conductive film 35, the first rectangular conductive film 35a and the second rectangular conductive film 35b as a mask, and first diffused layers 22, 22a and a second diffused layer 23 are formed on the surface of a silicon substrate 1.

Next, heat treatment is applied and impurities in the first diffused layers 22, 22a and the second diffused layer 23 are diffused. Successively, a silicon oxide film approximately 300 nm thick is formed overall by CVD, is polished by CMP using the buried conductive film 35, the first rectangular conductive film 35a and the second rectangular conductive film 35b as a stopper of polishing and an unnecessary part is removed. In the formation of the silicon oxide film by CVD, mono-silane (SiH$_4$) and dinitrogen monoxide (N$_2$O) are used for reaction gas and film forming temperature is 700 to 800° C. That is, a high temperature oxide (HTO) film is formed.

Figure 20C:
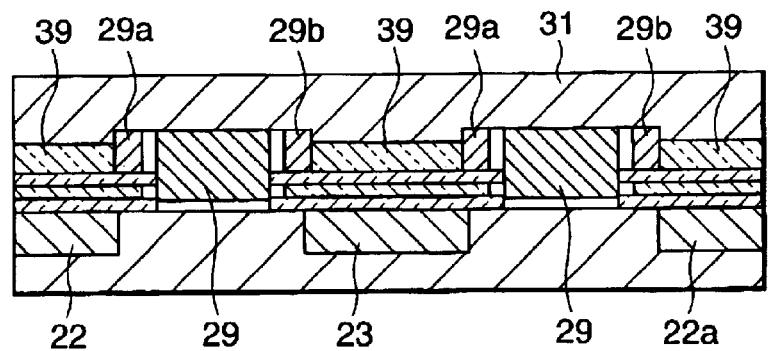

Hereby, as shown in FIG. 20C, an insulating film 39 approximately 200 nm thick is formed over the first diffused layers 22, 22a and the second diffused layer 23. As this HTO film is excellent in covering difference in a level, it completely fills between the rectangular conductive films. Further, the insulation performance and the quality of the HTO film are very high.

Next, as shown in FIG. 20C, a tungsten silicide film approximately 200 nm thick is deposited overall as a second conductive film, is worked by well-known lithography and dry etching technique and a word line 31 is formed. In process in which the word line 31 is formed, the buried conductive film 35, the first rectangular conductive film 35a and the second rectangular conductive film 35b are also worked, and a gate electrode 29, a first gate electrode end 29a and a second gate electrode end 29b are formed.

Hereby, as shown in FIG. 20C, a bit line of a memory cell is formed on the silicon substrate 1 by the first diffused layers 22, 22a and the second diffused layer 23 and an area for writing and erasing information charge is formed by the laminated films composed of a first insulating film, a second insulating film and a third insulating film respectively forming ONO structure. The word line 31 is arranged and the basic structure of the memory cell in the invention is completed.

In this case, the similar effect to that described in the third embodiment is produced, in addition, parasitic capacity between the word line 31 and the bit line (between the first and second diffused layers 22, 23) is reduced and the operation of a flash memory is sped up as a whole.

Next, referring to FIG. 21, a fifth embodiment of the invention will be described. FIG. 21 are also sectional views showing a nonvolatile storage cell applied to the similar flash memory cell to that described in relation to FIG. 20. FIG. 21 are different from FIG. 20 in that a fourth insulating film is formed on side walls at both ends of a second insulating film 25. The same reference number is allocated to the same component as that in the third (fourth) embodiment. The structure of the nonvolatile storage cell according to the invention is shown in the description of its manufacturing method.

Figure 21A:
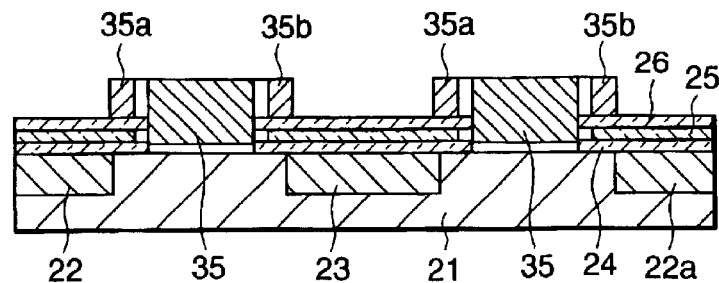
FIGS. 21A to 21D are sectional views in the order of steps in a manufacturing process of a nonvolatile storage cell for explaining a fifth embodiment of the present invention.

The substantially same steps are repeated as far as the step shown in FIG. 20B described in the fourth embodiment. That is, as shown in FIG. 21A, a first rectangular conductive film 35a and a second rectangular conductive film 35b are formed on side walls of a buried conductive film 35. First diffused layers 22, 22a and a second diffused layer 23 are formed on the surface of a silicon substrate 1.

Figure 21B:
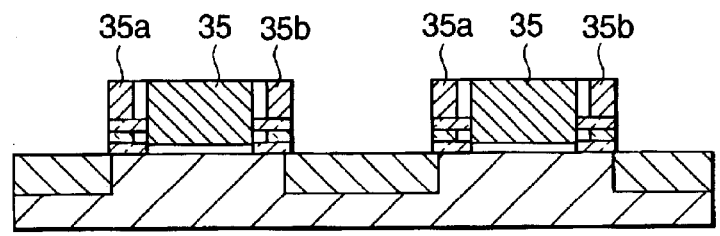

Next, as shown in FIG. 21B, a third insulating layer 26, a second insulating layer 25 and a first insulating layer 24 are sequentially removed by dry etching using the buried conductive film 35, the first rectangular conductive film 35a and the second rectangular conductive film 35b as a mask.

Next, thermal oxidation is executed in the atmosphere of radical oxygen or activated oxygen. Activated oxygen means oxygen in an excited state and includes an oxygen ion and neutral radical oxygen. Such activated oxygen can be generated by activating oxygen in a state of plasma, reacting hydrogen and oxygen under reduced pressure and thermally cracking ozone.

Figure 21C:
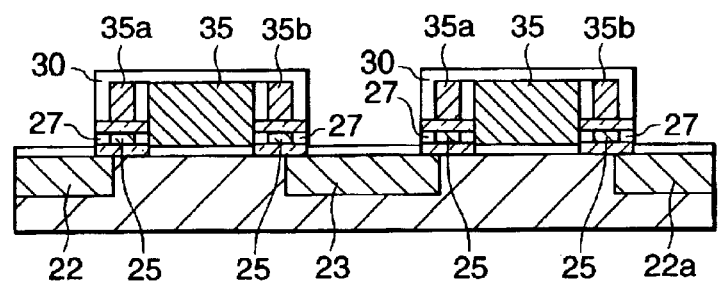

When the thermal oxidation is executed in the atmosphere of radical oxygen, the side wall of the second insulating layer 25 made of a silicon nitride film is also easily oxidized and a silicon oxide film is formed in a region described above. Hereby, as shown in FIG. 21C, the second insulating layer 25 made of the silicon nitride film is thermally oxidized and a fourth insulating layer 27 is formed on the sidewall. Similarly, each surface of the buried conductive film 35, the first rectangular conductive film 35a and the second rectangular conductive film 35b is also thermally oxidized and a side oxide film 30 is formed. Simultaneously, each surface of the first diffused layers 22, 22a and the second diffused layer 23 is also thermally oxidized and an oxide film is formed.

Successively, as in the fourth embodiment, an HTO film approximately 300 nm thick is formed overall by CVD, is polished by CMP using the buried conductive film 35, the first rectangular conductive film 35a and the second rectangular conductive film 35b as a stopper of polishing and an unnecessary part is removed.

Figure 21D:
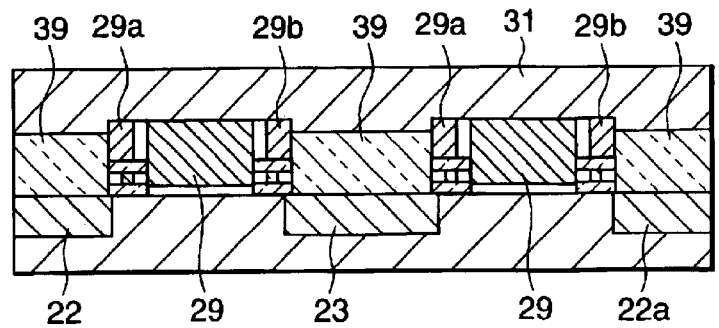

Hereby, as shown in FIG. 21D, an insulating film 39 approximately 200 nm thick is formed on the first diffused layers 22, 22a and the second diffused layer 23. As this HTO film is excellent in covering difference in a level, it completely fills between the rectangular conductive films. Further, the insulation performance and the quality of the HTO film are very high. Further, as shown in FIG. 21D, a tungsten silicide film approximately 200 nm thick is deposited overall as a second conductive layer, is worked by well-known lithography and dry etching technique and a word line 31 is formed. In process in which the word line 31 is formed, the buried conductive film 35, the first rectangular conductive film 35a and the second rectangular conductive film 35b are also worked, and a gate electrode 29, a first gate electrode end 29a and a second gate electrode end 29b are formed.

Hereby, as shown in FIG. 21D, a bit line of a memory cell is formed on the silicon substrate 1 by the first diffused layers 22, 22a and the second diffused layer 23 and an area for writing and erasing information charge is formed by the laminated films composed of a first insulating film, a second insulating film and a third insulating film; the side wall of which is sealed with the fifth insulating layer 27 respectively forming ONO structure. The word line 31 is arranged and the basic structure of the memory cell in the invention is completed.

In this case, the holding characteristic of information charge of the memory cell is more enhanced than that in the fourth embodiment. The reason is that the side walls of the second insulating layer 25 are completely sealed with the fourth insulating layer 27.

Next, referring to FIGS. 22 to 26, a sixth embodiment of the invention will be described. FIGS. 22 to 24 are sectional views in the order of steps in a manufacturing process of a nonvolatile storage cell applied to a flash memory cell according to the invention, and FIGS. 25 and 26 are plans in the order of steps. In the first to fifth embodiments, a capture area of information charge is provided to the sides of the first and second diffused layers of the MONOS transistor. In the meantime, in the sixth embodiment, a capture area of information charge is provided to the side of one diffused layer of an MONOS transistor. The structure of the nonvolatile storage cell according to the invention is shown in the description of a manufacturing method.

Figure 22A:
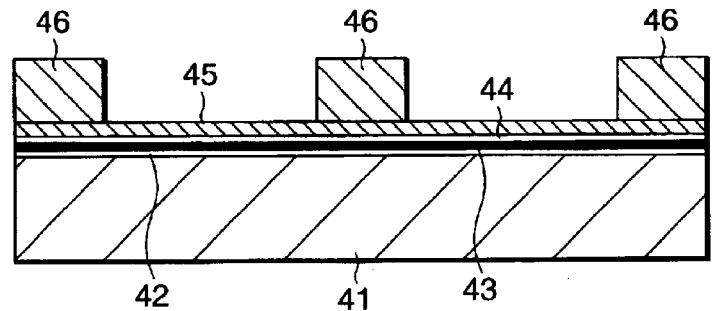
FIGS. 22A to 22D are sectional views in the order of steps in a manufacturing process of a nonvolatile storage cell for explaining a sixth embodiment of the present invention.

As shown in FIG. 22A, a first insulating film 42 is formed by thermally oxidizing a silicon substrate 1, a silicon nitride film to be a second insulating film 43 is formed by CVD and further, a third insulating film 44 is formed by the thermal oxidation including radical oxygen of the second insulating film 45. Afterward, an amorphous silicon layer 45 having the thickness of 20 nm is formed on the third insulating film 44. Afterward, a rectangular dummy insulating film 46 is formed by forming and patterning a silicon nitride film.

Figure 22B:
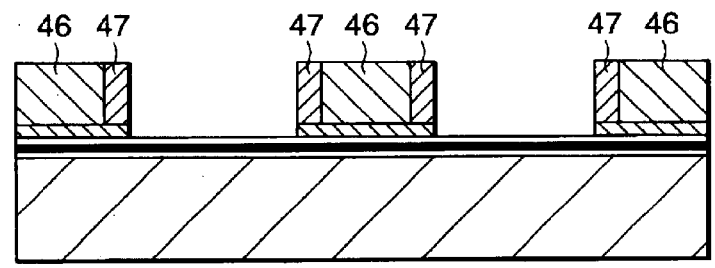

Next, as shown in FIG. 22B, a first side wall conductive film 47 is formed on the side wall of the dummy insulating film 46 by the formation and the etching-back of a polycrystalline silicon film and the silicon layer 45 is patterned by dry etching. The width of the first side wall conductive film 47 is approximately 50 nm.

Figure 22C:
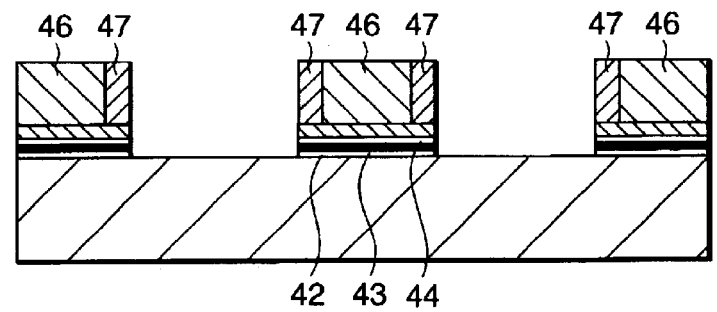

Next, as shown in FIG. 22C, the third insulating film 44, the second insulating film 43 and the first insulating film 42 are etched using the dummy insulating film 46 and the first side wall conductive film 47 as a mask.

Figure 22D:
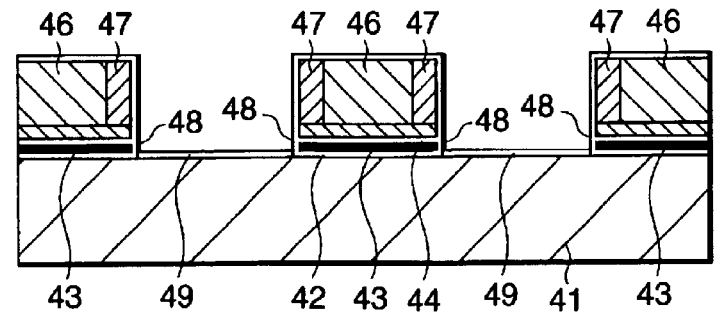

Next, thermal oxidation is executed in the atmosphere of radical oxygen or activated oxygen. When the thermal oxidation is executed in the atmosphere of radical oxygen, the side wall of the second insulating film 43 made of a silicon nitride film is also easily oxidized and a silicon oxide film is formed in a region described above. Hereby, as shown in FIG. 22D, the second insulating film 43 made of a silicon nitride film is thermally oxidized and a fourth insulating film 48 is formed on the side walls.

The surface of the dummy insulating film 46 similarly made of a silicon nitride film and the surface of the first side wall conductive film 47 are also thermally oxidized and a side oxide film is formed. Simultaneously, the surface of the silicon substrate 1 is also thermally oxidized and a gate insulating film 49 is formed. The thickness of the gate insulating film 49 is approximately 5 nm and is thinner than the effective thickness of laminated insulating films composed of a first insulating film 42, a second insulating film 43 and a third insulating film 44.

Figure 23A:
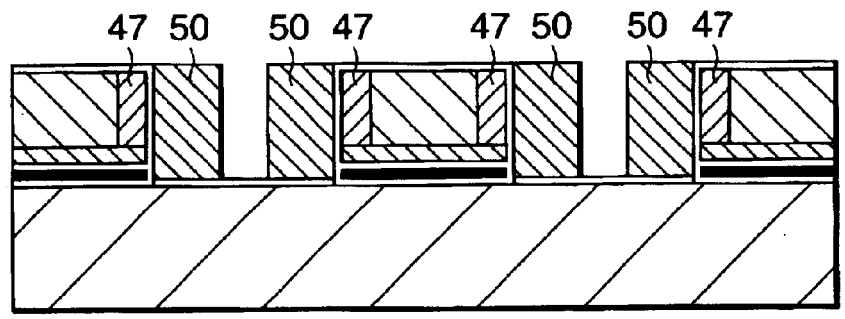
FIGS. 23A to 23C are sectional views in the order of steps in the manufacturing process succeeding FIG. 22D.

Next, again, the formation and the etching-back of a polycrystalline silicon film are executed and as shown in FIG. 23A, a second side wall conductive film 50 is formed on the side wall of the first side wall conductive film 47. The width of the second side wall conductive film 50 is approximately 100 nm.

Figure 23B:
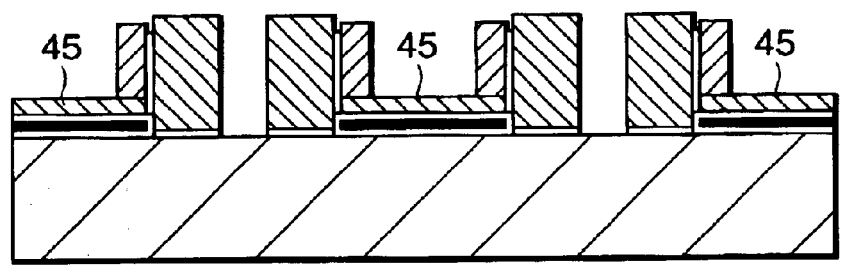
Figure 23C:
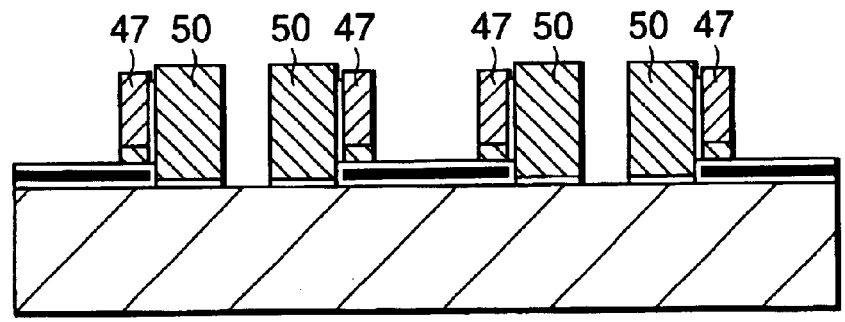

Afterward, as shown in FIG. 23B, the side oxide film and the dummy insulating film 46 are removed by etching and the silicon layer 45 is exposed. As shown in FIG. 23C, the silicon layer 45 is etched using the first side wall conductive film 47 and the second side wall conductive film 50 as a mask and the laminated insulating films having ONO structure are exposed.

Figure 24A:
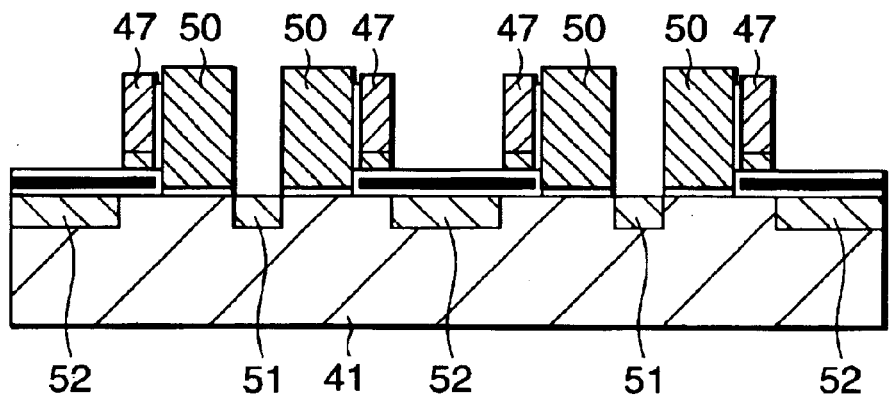
FIGS. 24A and 24B are sectional views in the order of steps succeeding FIG. 23C.

Next, as shown in FIG. 24A, an arsenic ion is implanted using the first side wall conductive film 47 and the second side wall conductive film 50 as a mask and heat treatment is applied. Hereby, a first diffused layer 51 and a second diffused layer 52 are formed on the surface of a silicon substrate 41.

Next, an HTO film approximately 300 nm thick is formed overall by CVD, is polished by CMP using the first side wall conductive film 47 and the second side wall conductive film 50 as a stopper of polishing and an unnecessary part is removed. Hereby, an insulating film 53 approximately 200 nm thick is formed over the first diffused layer 51 and the second diffused layer 52. As the HTO film is excellent in covering difference in a level, it completely fills between the first side wall conductive films 47 and between the second side wall conductive films 50. Further, the insulation performance and the quality of the HTO film are very high.

Figure 24B:
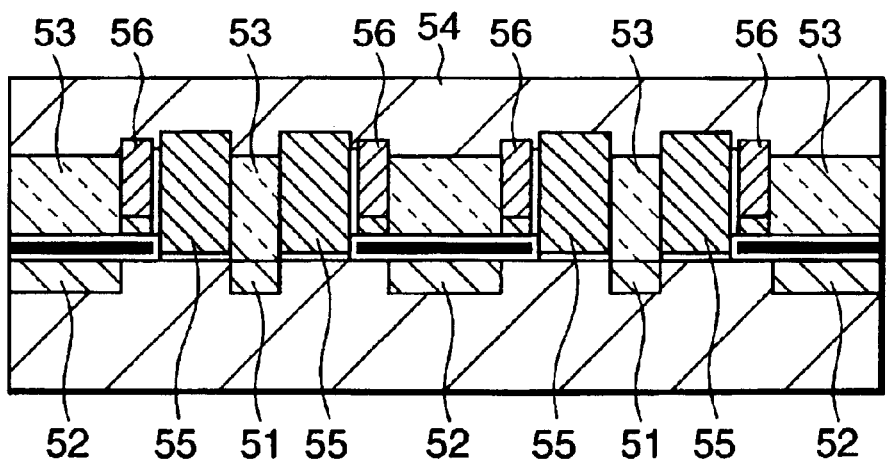

Next, as shown in FIG. 24B, a tungsten silicide film approximately 200 nm thick is deposited overall as a second conductive layer, is worked by well-known lithography and dry etching technique and a word line 54 is formed. In process in which the word line 54 is formed, the first side wall conductive film 47 and the second side wall conductive film 50 are also worked, and a gate electrode 55 and a gate electrode end 56 are formed. The gate electrode 55 and the gate electrode end 56 are connected to the word line 54.

Hereby, the nonvolatile storage cell applied to the flash memory cell according to the invention is completed.

Next, referring to plans, a manufacturing method of the nonvolatile storage cell applied to the memory cell will be schematically described.

Figure 25A:
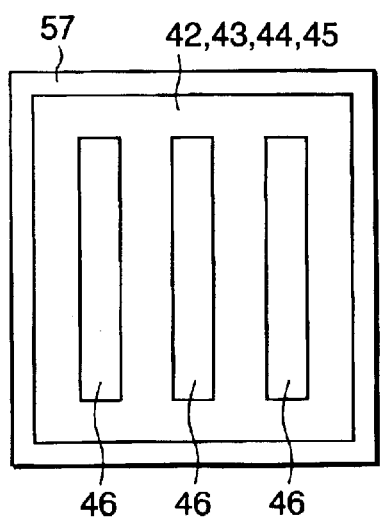
FIGS. 25A to 25D are plans in the order of steps in the manufacturing process of the nonvolatile storage cell for explaining the sixth embodiment of the present invention.

As shown in FIG. 25A, after a cell isolating region 57 is formed, the first insulating film 42, the second insulating film 43, the third insulating film 44 and the silicon layer 45 are formed as described in relation to FIG. 22. The dummy insulating film 46 is formed.

Figure 25B:
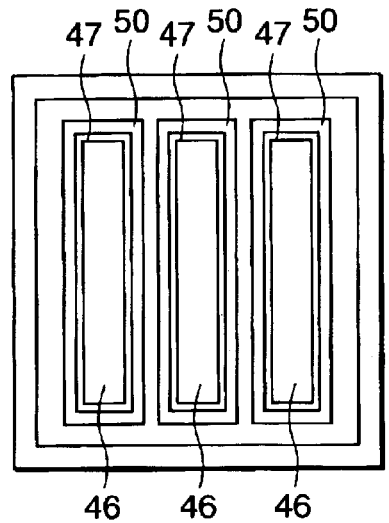

Next, in process shown in FIG. 25B, the first side wall conductive film 47 and the second side wall conductive film 50 are formed on the side walls of the dummy insulating film 46. This process corresponds to the process shown in FIG. 23A.

Figure 25C:
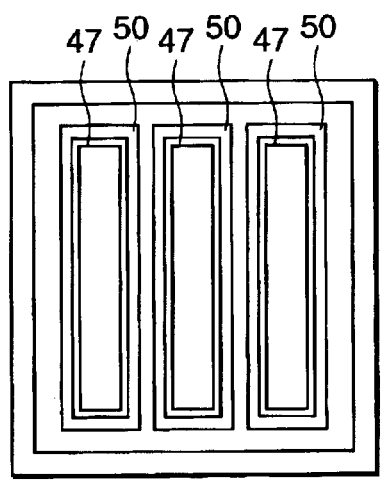

Next, as shown in FIG. 25C, the dummy insulating film 46 and the silicon layer 45 are removed by etching, and the first side wall conductive film 47 and the second side wall conductive film 50 are left. This process corresponds to the process shown in FIG. 23C.

Figure 25D:
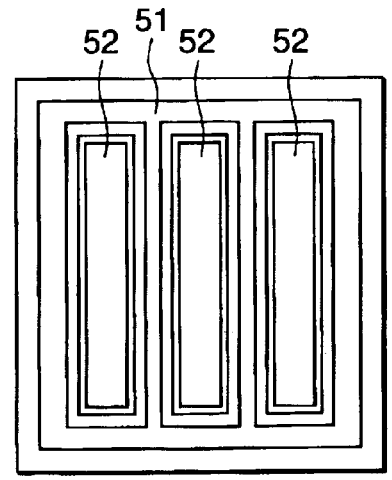

Next, as shown in FIG. 25D, the implantation of an arsenic ion and heat treatment are executed overall, and the first diffused layer 51 and the second diffused layer 52 are formed. This process corresponds to the process shown in FIG. 24A.

Next, as shown in FIG. 26A, the insulating film 53 over the diffused layer is filled between the first side wall conductive films 47 and between the second side wall conductive films 50. The tungsten silicide film approximately 200 nm thick is deposited overall, is worked by well-known lithography and dry etching technique and as shown in FIG. 26B, the word line 54 is arranged. Further, as shown in FIG. 26C, the first side wall conductive film 47 and the second side wall conductive film 50 are patterned by dry etching using the word line 54 as a mask. Hereby, the gate electrode 55 and the gate electrode end 56 are formed.

Finally, a layer insulating film is formed overall, a through hole is formed in a predetermined region and as shown in FIG. 26D, a bit line 58 and a grounding conductor 59 are arranged.

In this case, the capture area of information charge of the memory cell is provided by one location and has the configuration of one bit per cell. In this case, the holding characteristic is also greatly enhanced. Parasitic capacity between the word line and the bit line is reduced by the insulating film 53 over the diffused layer and the operation of the flash memory is sped up as a whole.

Next, referring to FIG. 27, a seventh embodiment of the invention will be described. FIG. 27 are sectional views in the order of steps in a manufacturing process of a nonvolatile storage cell applied to the similar flash memory cell to that described in the sixth embodiment. The seventh embodiment is different from the sixth embodiment in that laminated insulating films having ONO structure on a first diffused layer 51 and a second diffused layer 52 are removed and both ends of a second insulating film 43 are sealed with a silicon oxide film. The same reference number is allocated to the same component as that in the sixth embodiment. The structure of the nonvolatile storage cell according to the invention is shown in the description of its manufacturing method.

Figure 27A:
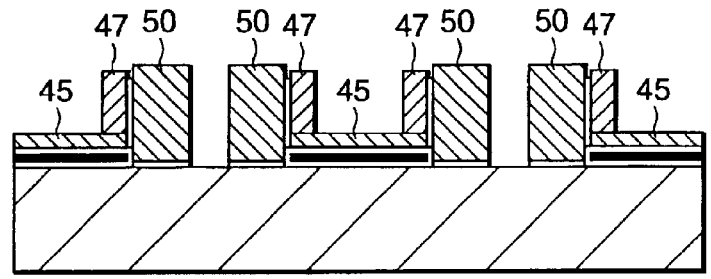
FIGS. 27A to 27D are sectional views in the order of steps in a manufacturing process of a nonvolatile storage cell for explaining a seventh embodiment of the present invention.
Figure 27B:
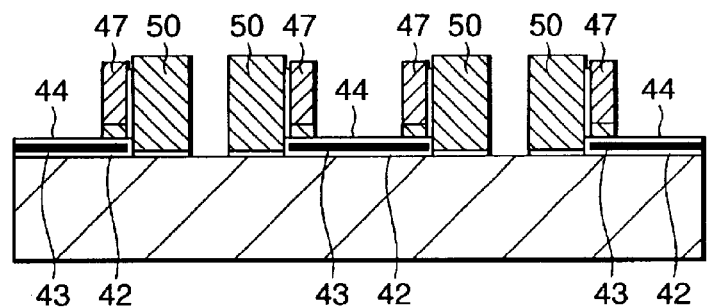

Process in FIGS. 27A and 27B is substantially the same as the process as far as FIG. 23C described in the sixth embodiment. That is, a silicon layer 45 is exposed by etching using a first side wall conductive film 47 and a second side wall conductive film 50 as a mask. Further, the silicon layer 45 is etched using the first side wall conductive film 47 and the second side wall conductive film 50 as a mask, and a first insulating film 42, a second insulating film 43 and a third insulating film 44 respectively laminated are exposed.

Figure 27C:
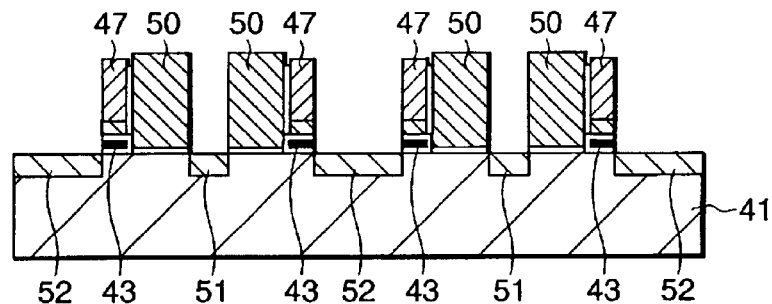

As shown in FIG. 27C, an arsenic ion is implanted using the first side wall conductive film 47 and the second side wall conductive film 50 as a mask and heat treatment is applied. Hereby, the first diffused layer 51 and the second diffused layer 52 are formed on the surface of a silicon substrate 41. Next, the first insulating film 42, the second insulating film 43 and the third insulating film 44 respectively laminated on the first diffused layer 51 and the second diffused layer 52 are removed by etching using the first side wall conductive film 47 and the second side wall conductive film 50 as a mask. Hereby, the end of the second insulating film 43 is exposed.

Next, an HTO film approximately 300 nm thick is formed overall by CVD, is polished by CMP using the first side wall conductive film 47 and the second side wall conductive film 50 as a stopper of polishing and an unnecessary part is removed. Hereby, an insulating film 53 approximately 200 nm thick is formed on the first diffused layer 51 and the second diffused layer 52. The end of the second insulating film 43 is completely sealed with a silicon oxide film by the insulating film 53 on the diffused layer.

Figure 27D:
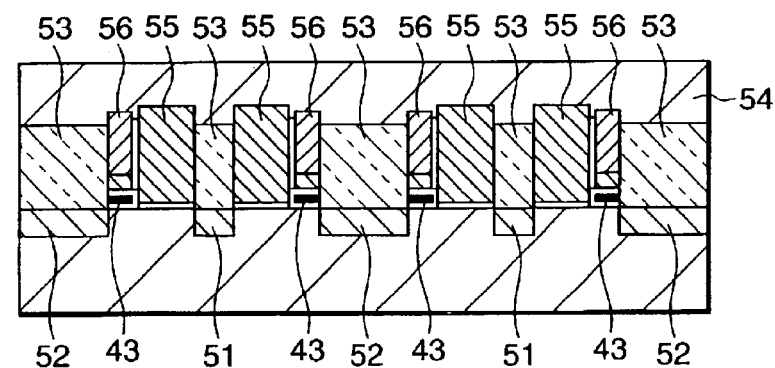

As shown in FIG. 27D, a tungsten silicide film approximately 200 nm thick is deposited overall as a second conductive layer, is worked by well-known lithography and dry etching technique and a word line 54 is formed. In process in which the word line 54 is formed, the first side wall conductive film 47 and the second side wall conductive film 50 are also worked, and a gate electrode 55 and a gate electrode end 56 are formed. The gate electrode 55 and the gate electrode end 56 are connected to the word line 54. Hereby, the nonvolatile storage cell applied to the flash memory cell according to the invention is completed.

In this case, a capture area of information charge of the memory cell is provided by one location and has the configuration of one bit per cell. Its holding characteristic is greatly enhanced, parasitic capacity between the word line and a bit line is reduced and the operation of a flash memory is sped up as a whole.

In the embodiments described above, the case that the first insulating film and the third insulating film respectively forming the MONOS transistor are formed by a silicon oxide film and the second insulating film is formed by a silicon nitride film or a silicon film is described. The present invention is not limited to such configuration and a metallic oxide film such as a tantalum oxide film and a hafnium oxide film may be also used for a second insulating film. Further, a reformed layer acquired by thermally nitrifying the surface of a silicon oxide film may be also used for a second insulating film.

In the embodiments described above, information charge of the nonvolatile semiconductor memory is captured and held in the capture area of the second insulating layer or the semiconductor layer. When the present invention is further developed, information charge can be captured and held not in the laminated films but in an insulator isolated semi-spherically or in a dot for example which is an isolated insulator (an isolated substance). For example, the isolated insulator is a semi-spherical silicon nitride the diameter of which is approximately 3 nm (10 nm or less). The semi-spherical silicon nitride can be generated by reduced-pressure CVD using dichlorosilane ($SiH_2Cl_2$) and $NH_3$ as reaction gas. When the reaction gas is used, nucleus formation occurs in initial process in which a silicon nitride film is formed. When the formation of the silicon nitride film is stopped as soon as the nucleus becomes suitable size, the semi-spherical silicon nitride described above is generated.

Further, the capture area of information charge may be also an isolated substance which is made of silicon, silicon germanium or high-melting point metal and which is isolated discontinuously, that is, formed semi-spherically or in a dot.

In that case, the area for writing information charge (the capture area) is located in the center of a trap existing in the isolated substance or in an interface area between the isolated substance and a silicon oxide film around the isolated substance. The capture area is isolated by the silicon oxide film having high insulation performance. Therefore, electrons written to the isolated substance are closed in the area and the holding characteristic of information charge is further enhanced. Such an isolated substance is a substance discontinuously formed and each substance has only to be mutually isolated by another insulating material having high insulation performance. Such an isolated substance may also have insular or prismatic structure in addition to the semi-spherical or dotted structure.

In the embodiments described above, when the silicon layer is formed on the laminated films having ONO structure or OSO structure, the silicon layer fulfills a function of protecting the laminated films having ONO structure or OSO structure from damage in the manufacturing process. In the invention, the reliable nonvolatile storage cell can be easily formed.

In the embodiments described above, for material of the gate electrode, a silicon germanium film may be also used in place of the polycrystalline silicon film.

The invention is not limited to the embodiments and in a scope of the technical idea according to the invention, the embodiments may be suitably changed.

When the nonvolatile storage cell according to the invention is applied to a flash memory, as the capture area for holding information charge is isolated by the side wall insulating layer, the holding characteristic of information is greatly enhanced. The speeding-up and the reduction of voltage of the operation, particularly operation for reading stored information are promoted and operation for written and erasing information charge to/from the flash memory are further sped up. Hereby, the increase of the capacitance of the flash memory, the enhancement of the function and the provision of multiple functions are facilitated. The resistance of the word line or the bit line forming the memory cell is easily reduced by the invention and transmission delay in the memory cell is greatly reduced.

Further, when the invention is applied to a flash memory, the mass production of the product is facilitated very much and the manufacturing cost is greatly reduced.

The great enhancement described above of the characteristics of the flash memory increases the application of the device and also develops new application.

What is claimed is:

1. A nonvolatile semiconductor memory device, comprising:

a semiconductor substrate of a first conductive type;

first and second diffused layers of a second conductive type on the surface of the semiconductor substrate, with a channel region of the semiconductor substrate therebetween;

first and second laminated films above edge portions of the channel region and above edge portions of, respectively, the first and the second diffused layers, each laminated film being laminated from the semiconductor substrate and the respective diffused layer in the order of a first insulating layer as a first film, a second insulating layer or a semiconductor layer as a second film, and a third insulating layer as a third film;

a fourth insulating layer on the semiconductive substrate channel region at a location where the laminated films are absent;

each of the second insulating layers or each of the semiconductor layers having a fifth insulating layer on a side wall thereof; and a gate electrode comprising a first conductive film on the fourth insulating layer and second and third conductive films of the first and second laminated films, respectively, the gate electrode entirely overlying the upper sides of fourth insulating layer, the first laminated film, and the second laminated film.

2. A nonvolatile semiconductor memory device according to claim 1, wherein:

the capacitance value per unit area of the fourth insulating layer is larger than the capacitance value per unit area of the laminated films.

3. A nonvolatile semiconductor memory device according to claim 1, wherein:

the third insulating layer of the third film of each of the laminated films comprises a silicon oxide film;

the second insulating layer of the second film of each of the laminated films comprises a silicon nitride film;

the first insulating layer of the first film of each of the laminated films comprises a silicon oxide film, and each fifth insulating layer comprises a silicon oxide film.

4. A nonvolatile semiconductor memory device according to claim 1, wherein:

the third insulating layer of the third film of each of the laminated films comprises a silicon oxide film;

the semiconductor layer of the second film of each of the laminated films comprises a silicon film;

the first insulating layer of the first film of each of the laminated films comprises a silicon oxide film; and each fifth insulating layer comprises a silicon oxide film.

5. A nonvolatile semiconductor memory device according to claim 1, wherein:

the cross section of the gate electrode has a T shape.

6. A nonvolatile semiconductor memory device according to claim 1, wherein:

an end of each of the second and the third conductive films overlaps a respective one of the first diffused layer and the second diffused layer through the respective one of the laminated films.

7. A nonvolatile semiconductor memory device according to claim 1, wherein:

the first conductive film comprises a material different from the material of the second conductive film and the third conductive film.

8. A nonvolatile semiconductor memory device according to claim 1, wherein said gate electrode further comprises:

an insulating film between the side walls of the first conductive film and the side walls of the second conductive film and the third conductive film.

9. A nonvolatile semiconductor memory device according to claim 1, wherein:

the laminated films are restrictively formed on the upper sides of the edge portions of the channel region and the upper sides of the edge portions of the respective ones of the first and second diffused layers.

10. A nonvolatile semiconductor memory device according to claim 1, wherein:

the gate electrode is connected to a word line of a memory cell; and the first diffused layer or the second diffused layer functions as a part of a bit line of the memory cell.

11. A nonvolatile semiconductor memory device according to claim 1, wherein:

the second and third conductive films contact the first conductive film to provide a continuous conductive film layer as the gate electrode.

12. A nonvolatile semiconductor memory device according to claim 1, wherein:

each of the second conductive film and the third conductive film comprises a first gate electrode end adjacent the first conductive film and a second gate electrode end adjacent the respective first gate electrode end.

13. A nonvolatile semiconductor memory device according to claim 1, wherein:

each fifth insulating layer is on an external side wall of the respective second insulating layer or semiconductor layer, and each second insulating layer or semiconductor layer has a sixth insulating layer on an internal side wall thereof, adjacent the first conductive film.

14. A nonvolatile semiconductor memory device according to claim 1, wherein:

the laminated films are on the upper sides of the edge portions of the channel region and the upper sides of the respective ones of the first and second diffused layers.

15. A nonvolatile semiconductor memory device according to claim 14, wherein:

the second and third conductive films are on the laminated films and the upper sides of the respective ones of the first and second diffused layers.

16. A nonvolatile semiconductor memory device according to claim 11, wherein:

the first conductive film, the second conductive film, and the third conductive film comprise a single film.

17. A nonvolatile semiconductor memory device, comprising:

a semiconductor substrate;

a first diffused layer and a second diffused layer on the surface of the semiconductor substrate, with a channel region of the semiconductor substrate between the first and second diffused layers;

a first insulating layer, an isolated substance and a third insulating layer in order on the upper side of each end portion of the channel region, adjacent to the first diffused layer and the second diffused layer;

a fourth insulating layer on the channel region in location having no first insulating layer, no isolated substance and no third insulating layer; and a gate electrode entirely covering the upper sides of the first insulating layer, the isolated substance, the third insulating layer and the fourth insulating layer.

18. A nonvolatile semiconductor memory device according to claim 17, wherein:
   each of the first insulating layer and the third insulating layer comprises a silicon oxide film; and
   the isolated substance comprises silicon nitride, silicon, silicon germanium or high-melting point metal.

19. A nonvolatile semiconductor memory device according to claim 17, wherein:
   the capacitance value per unit area of the fourth insulating layer is larger than the capacitance value per unit area of the combined first insulating layer, isolated substance, and third insulating layer.

20. A nonvolatile semiconductor memory device according to claim 17, wherein:
   the gate electrode comprises a continuous conductive film layer.

21. A nonvolatile semiconductor memory device according to claim 17, wherein:
   the gate electrode comprises a conductive film, a first pair of gate electrode ends adjacent respective ends of the conductive film, and a second pair of gate electrode ends adjacent respective ones of the first gate electrode ends.

* * * * *